(12) United States Patent
Moon et al.

(10) Patent No.: US 12,200,922 B2
(45) Date of Patent: Jan. 14, 2025

(54) SEMICONDUCTOR MEMORY DEVICE AND A METHOD OF MANUFACTURING THE SAME

(71) Applicant: SAMSUNG ELECTRONICS CO., LTD., Suwon-si (KR)

(72) Inventors: Daeyoung Moon, Seoul (KR); Jamin Koo, Hwaseong-si (KR); Kyuwan Kim, Suwon-si (KR); Kisoo Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 145 days.

(21) Appl. No.: 18/116,883

(22) Filed: Mar. 3, 2023

(65) Prior Publication Data

US 2023/0209805 A1 Jun. 29, 2023

Related U.S. Application Data

(63) Continuation of application No. 17/358,055, filed on Jun. 25, 2021, now Pat. No. 11,631,677.

(30) Foreign Application Priority Data

Dec. 1, 2020 (KR) .......................... 10-2020-0165367

(51) Int. Cl.
*H10B 12/00* (2023.01)

(52) U.S. Cl.
CPC ......... *H10B 12/315* (2023.02); *H10B 12/033* (2023.02); *H10B 12/34* (2023.02); *H10B 12/482* (2023.02); *H10B 12/485* (2023.02)

(58) Field of Classification Search
None
See application file for complete search history.

(56) References Cited

U.S. PATENT DOCUMENTS

| | | |
|---|---|---|
| 6,589,837 B1 | 7/2003 | Ban et al. |
| 7,297,998 B2 | 11/2007 | Kim et al. |
| 7,459,353 B2 | 12/2008 | Son et al. |
| 9,431,324 B2 * | 8/2016 | Shin ..................... H10B 12/488 |
| 10,818,684 B2 | 10/2020 | Cheon et al. |

(Continued)

FOREIGN PATENT DOCUMENTS

| | | |
|---|---|---|
| KR | 10-0197128 B1 | 6/1999 |
| KR | 10-0330714 B1 | 4/2002 |

(Continued)

*Primary Examiner* — Steven M Christopher
(74) *Attorney, Agent, or Firm* — Muir Patent Law, PLLC

(57) ABSTRACT

A semiconductor memory device includes a device isolation pattern on a substrate to define an active region, a word line in the substrate, to intersect the active region, a first dopant region in the active region as at a first side of the word line, a second dopant region in the active region at a second side of the word line, a bit line connected to the first dopant region and intersecting the word line, a bit line contact connecting the bit line to the first dopant region, a landing pad on the second dopant region, and a storage node contact connecting the landing pad to the second dopant region, the storage node contact including a first portion in contact with the second dopant region, the first portion including a single-crystal silicon, and a second portion on the first portion and including a poly-silicon.

20 Claims, 17 Drawing Sheets

(56) References Cited

U.S. PATENT DOCUMENTS

2015/0294923 A1* 10/2015 Shin ..................... H01L 23/481
257/532
2020/0194374 A1    6/2020  Kim et al.
2020/0402804 A1   12/2020  Kim et al.

FOREIGN PATENT DOCUMENTS

| KR | 10-2005-0104231 A | 11/2005 |
| KR | 10-0557994 B1 | 3/2006 |
| KR | 10-0599043 B1 | 7/2006 |
| KR | 10-0681210 B1 | 2/2007 |
| KR | 10-1062290 B1 | 9/2011 |
| KR | 10-1162258 B1 | 7/2012 |
| KR | 10-2018-0131915 A | 12/2018 |
| KR | 10-2019-0117954 A | 10/2019 |
| KR | 10-2020-0074659 A | 6/2020 |

* cited by examiner

SEMICONDUCTOR MEMORY DEVICE AND A METHOD OF MANUFACTURING THE SAME

CROSS-REFERENCE TO RELATED APPLICATION

This application is a continuation of U.S. patent application Ser. No. 17/358,055 filed Jun. 25, 2021, which is incorporated by reference herein in its entirety.

Korean Patent Application No. 10-2020-0165367, filed on Dec. 1, 2020, in the Korean Intellectual Property Office, and entitled: "Semiconductor Memory Device and a Method of Manufacturing the Same," is incorporated by reference herein in its entirety.

BACKGROUND

1. Field

Embodiments relate to a semiconductor memory device and a method of manufacturing the same.

2. Description of the Related Art

Semiconductor devices are widely used in an electronic industry because of their small sizes, multi-functional characteristics, and/or low manufacturing costs. Semiconductor devices may be categorized as, e.g., semiconductor memory devices for storing logical data, semiconductor logic devices for processing logical data, and hybrid semiconductor devices having both the function of the semiconductor memory devices and the function of the semiconductor logic devices.

High-speed and low-voltage semiconductor devices have been considered for electronic devices including semiconductor devices, e.g., due to their high speed and/or low power consumption, and are highly integrated. However, since reliability of semiconductor devices may be deteriorated by their high integration density, research has been conducted to improve reliability of such semiconductor devices.

SUMMARY

Embodiments may be realized by providing a semiconductor memory device including a device isolation pattern defining an active region in a substrate, a word line disposed in the substrate and intersecting the active region, a first dopant region disposed in the active region at one side of the word line, a second dopant region disposed in the active region at another side of the word line, a bit line connected to the first dopant region and intersecting the word line, a bit line contact connecting the bit line to the first dopant region, a landing pad disposed on the second dopant region, and a storage node contact connecting the landing pad to the second dopant region, wherein the storage node contact may include a first portion being in contact with the second dopant region, and a second portion located on the first portion, and the first portion may include single-crystal silicon, and the second portion may include poly-silicon.

Embodiments may be realized by providing a semiconductor memory device including a substrate including an active region, an interlayer insulating pattern covering the substrate, a bit line intersecting the active region in one direction, a bit line contact penetrating the interlayer insulating pattern and disposed between the active region and the bit line, a landing pad disposed on each of end portions of the active region, and a storage node contact penetrating the interlayer insulating pattern and disposed between the landing pad and each of the end portions of the active region, wherein the storage node contact may include a first storage node contact connected to each of the end portions of the active region, and a second storage node contact connected to the landing pad, the first storage node contact and the second storage node contact may include the same material, and a crystallinity of the first storage node contact may be different from a crystallinity of the second storage node contact, and an interface of the first storage node contact and the second storage node contact may be located at a level between a bottom surface and a top surface of the bit line contact.

Embodiments may be realized by providing a method of manufacturing a semiconductor memory device, the method including forming a bit line structure on a substrate in which an active region is defined by a device isolation pattern and a word line is buried, the bit line structure including a bit line intersecting the active region in one direction, and a bit line contact connected to the active region, forming spacers on both sidewalls of the bit line structure, exposing a portion of a top surface of the active region by using the spacer as a mask, and forming a storage node contact being in contact with a sidewall of the spacer, wherein the forming of the storage node contact may include forming a first portion of a single-crystal phase from the exposed active region by a selective epitaxial growth (SEG) process, forming a second portion of an amorphous phase on the first portion, the second portion including a void, and performing a thermal treatment process on the second portion to remove the void of the second portion, and the amorphous phase of the second portion may be changed into a poly-crystal phase or a single-crystal phase by the thermal treatment process.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
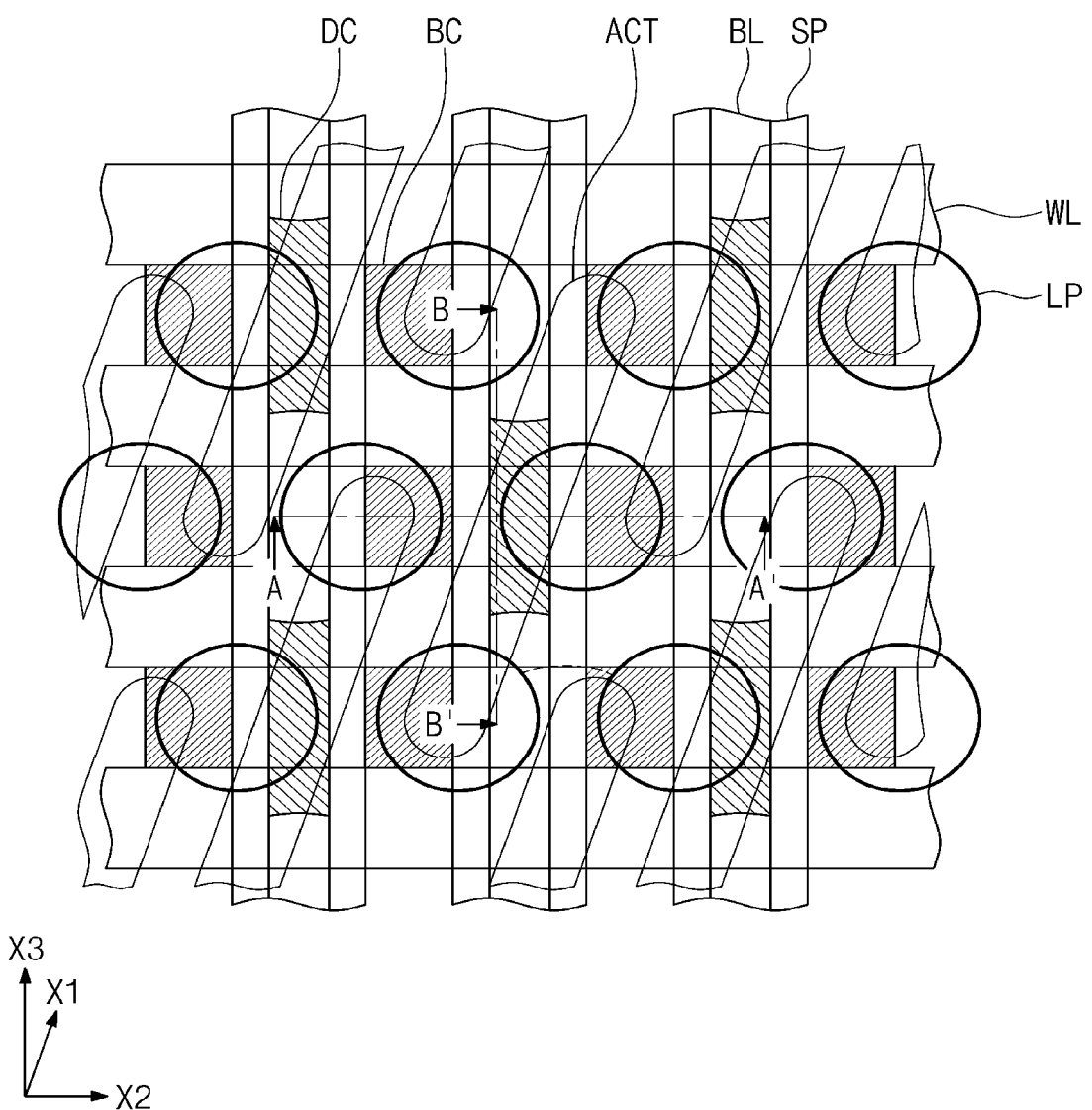
FIG. 1 is a plan view of a semiconductor memory device according to some example embodiments.
Figure 2:
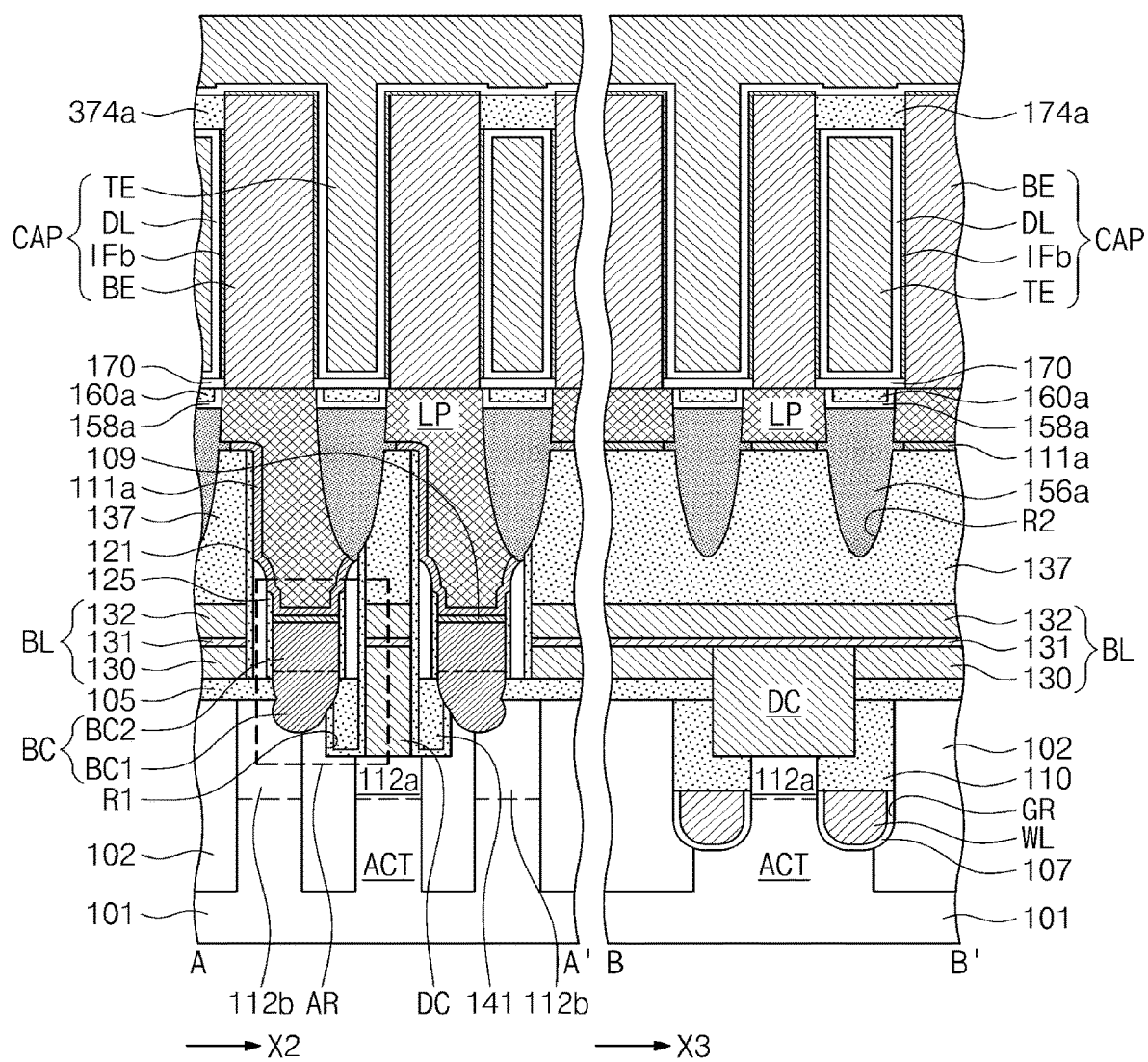
FIG. 2 is a cross-sectional view of a semiconductor memory device according to some example embodiments.
Figure 3:
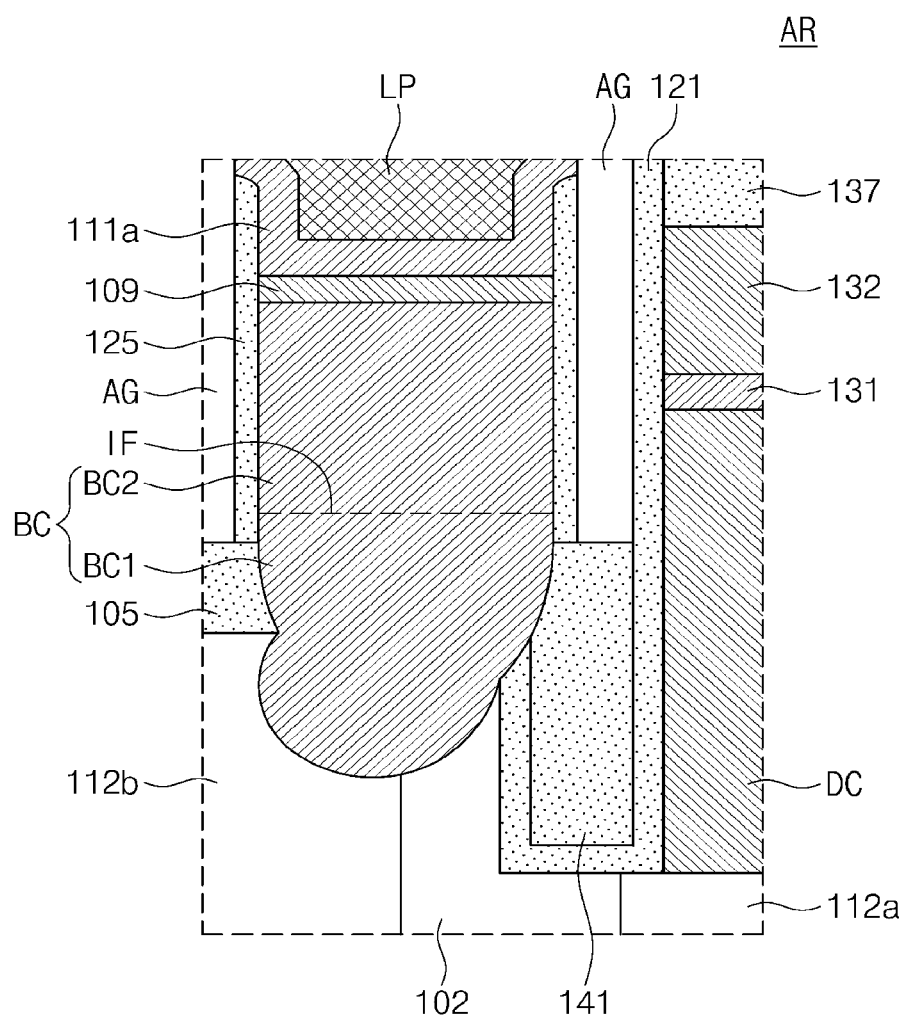
FIGS. 3 and 4 are enlarged views of region 'AR' of FIG. 2.
Figure 4:
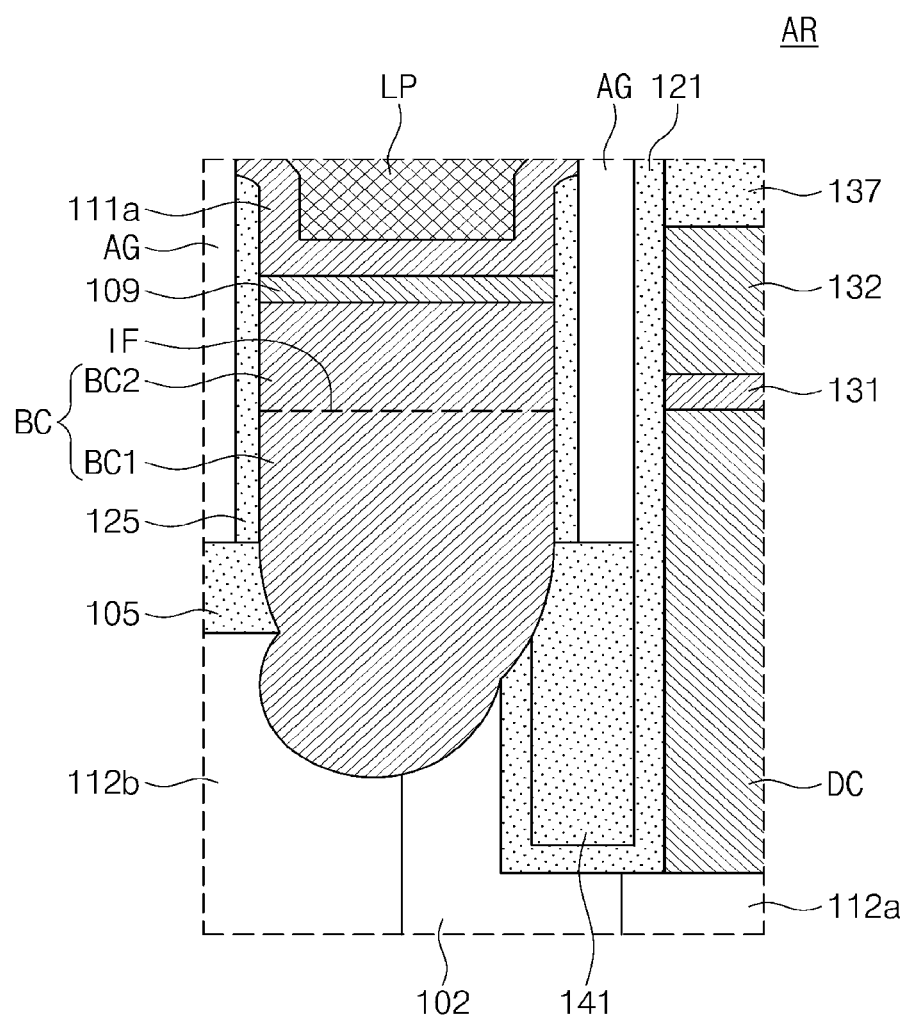

FIG. 1 is a plan view of a semiconductor memory device according to some example embodiments. FIG. 2 is a cross-sectional view taken along lines A-A' and B-B' of FIG. 1, and FIGS. 3 and 4 are enlarged views of region 'AR' of FIG. 2.

Referring to FIGS. 1 and 2, a substrate 101 may be provided. The substrate 101 may include a semiconductor substrate. In an implementation, the substrate 101 may be, e.g., a silicon (Si) substrate, a germanium (Ge) substrate, or a silicon-germanium (Si—Ge) substrate.

A device isolation pattern 102 may be disposed in the substrate 101 to define active regions ACT. Each of the active regions ACT may have an isolated shape such as an island shape. Each of the active regions ACT may have a bar shape extending in a first direction X1 when viewed in a plan view. Each of the active regions ACT may correspond to a portion of the substrate 101, which is surrounded by the device isolation pattern 102 when viewed in a plan view. The active regions ACT may be arranged in parallel to each other in the first direction X1 and may be arranged in such a way that an end portion of one active region ACT is adjacent to a center of another active region ACT adjacent thereto.

Word lines WL may be provided in the substrate 101. The word lines WL may intersect the active regions ACT. The word lines WL may be respectively disposed in grooves GR formed in the device isolation pattern 102 and the active regions ACT. The word lines WL may be parallel to a second direction X2 intersecting the first direction X1. The word lines WL may include a conductive material. Bottom surfaces of the word lines WL may be rounded and/or uneven.

A gate dielectric layer 107 may be disposed between the word line WL and an inner surface of the groove GR. The gate dielectric layer 107 may include, e.g., at least one of silicon oxide (SiO), silicon nitride (SiN), silicon oxynitride (SiON), or a high-k dielectric material.

A first dopant region 112a may be disposed in each active region ACT between a pair of the word lines WL. A pair of second dopant regions 112b may be disposed in both edge regions of each active region ACT, respectively. The first and second dopant regions 112a and 112b may be doped with dopants. In an implementation, the dopants may include N-type dopants. The first dopant region 112a may correspond to a common drain region, and the second dopant regions 112b may correspond to source regions. Each of the word lines WL and the first and second dopant regions 112a and 112b adjacent thereto may constitute a transistor.

Top surfaces of the word lines WL may be lower than top surfaces of the active regions ACT. A word line capping pattern 110 may be disposed on each of the word lines WL. The word line capping patterns 110 may have line shapes extending in a longitudinal direction of the word lines WL. The word line capping patterns 110 may cover the top surfaces of the word lines WL. Top surfaces of the word line capping patterns 110 may be located at substantially the same level as a top surface of the device isolation pattern 102. The word line capping patterns 110 may include silicon nitride.

An interlayer insulating pattern 105 may be disposed on the substrate 101. The interlayer insulating pattern 105 may have island shapes spaced apart from each other in a plan view. The interlayer insulating pattern 105 may cover end portions of two active regions ACT adjacent to each other. The interlayer insulating pattern 105 may include an insulating material. In an implementation, the interlayer insulating pattern 105 may be formed of a single or multi-layer including at least one of, e.g., a silicon oxide layer, a silicon nitride layer, or a silicon oxynitride layer.

Upper portions of the substrate 101, the device isolation pattern 102 and the word line capping pattern 110 may be partially recessed to form a first recess region R1. The first recess region R1 may have a mesh shape when viewed in a plan view. Bit lines BL may be disposed on the interlayer insulating pattern 105. The bit lines BL may intersect the word line capping patterns 110 and the word lines WL. As illustrated in FIG. 1, the bit lines BL may extend in a third direction X3 intersecting the first and second directions X1 and X2. Each of the bit lines BL may include a poly-silicon pattern 130, an ohmic pattern 131, and a metal-containing pattern 132, which are sequentially stacked. The poly-silicon pattern 130 may include, e.g., poly-silicon doped with dopants or undoped poly-silicon. The ohmic pattern 131 may include, e.g., a metal silicide. The metal-containing pattern 132 may include at least one of, e.g., a metal or a conductive metal nitride. In an implementation, the metal may include, e.g., tungsten (W), titanium (Ti), or tantalum (Ta). In an implementation, the conductive metal nitride may include, e.g., titanium nitride (TiN), tantalum nitride (TaN), or tungsten nitride (WN). Bit line capping patterns 137 may be disposed on the bit lines BL, respectively. The bit line capping patterns 137 may include an insulating material, e.g., silicon nitride.

A bit line contact DC may be disposed in the first recess region R1 intersecting the bit line BL. The bit line contact DC may include poly-silicon doped with dopants or undoped poly-silicon. The bit line contact DC may penetrate the interlayer insulating pattern 105 so as to be electrically connected to the first dopant region 112a and may electrically connect the first dopant region 112a to the bit line BL. The bit line BL and the bit line contact DC may constitute a bit line structure.

A filling insulation pattern 141 may be disposed in the first recess region R1 in which the bit line contact DC is not disposed. In an implementation, the filling insulation pattern 141 may have a single-layered or multi-layered structure including at least one of, e.g., a silicon oxide layer, a silicon nitride layer, or a silicon oxynitride layer.

As illustrated in FIG. 1, storage node contacts BC may be disposed between a pair of the bit lines BL adjacent to each other. The storage node contacts BC may be spaced apart from each other. A portion of each of the storage node contacts BC may be disposed in each of the end portions of the active regions ACT. In detail, as illustrated in FIG. 2, the storage node contacts BC may be connected to the second dopant regions 112b of the active regions ACT, respectively. Lower portions of the storage node contacts BC may penetrate the interlayer insulating pattern 105 so as to be disposed in the active regions ACT. Top surfaces of the storage node contacts BC may be located at a higher level than a top surface of the interlayer insulating pattern 105. For example, as illustrated in FIG. 2, the top surfaces of the storage node contacts BC may be flat. In another example, the top surfaces of the storage node contacts BC may be concave. Each of the storage node contacts BC may include a first portion BC1 corresponding to a lower portion of the storage node contact BC and a second portion BC2 corresponding to an upper portion of the storage node contact BC. Hereinafter, the first portion BC1 of the storage node contact BC will be referred to as a first storage node contact BC1, and the second portion BC2 of the storage node contact BC will be referred to as a second storage node contact BC2. These will be described in more detail with reference to FIGS. 3 and 4.

Referring to FIG. 3, the first storage node contact BC1 may penetrate the interlayer insulating pattern 105 so as to be disposed in the active region ACT. A portion of the first storage node contact BC1 may protrude from a lower portion of the first storage node contact BC1 into the second dopant region 112b, e.g., a bottom part of the first storage node contact BC1 may protrude into the second dopant region 112b. The portion of the first storage node contact BC1, which protrudes into the second dopant region 112b, may extend under the interlayer insulating pattern 105 in a direction oriented away from the bit line contact DC, e.g., a bottom part of the first storage node contact BC1 may be tilted away from the bit line contact DC to partially overlap a bottom of the interlayer insulating pattern 105. A bottom surface of the first storage node contact BC1 may be curved or uneven. The first storage node contact BC1 may include, e.g., silicon (Si). In an implementation, the first storage node contact BC1 may include single-crystal silicon (Si). In the present specification, the term 'single-crystal' means that a grain boundary does not exist in a corresponding component but the corresponding component has the same crystal orientation. In addition, the term 'substantially single-crystal' means that the corresponding component is virtually single-crystalline even though a grain boundary locally exists in the corresponding component or even though a portion having a different crystal orientation locally exists in the corresponding component. In an implementation, a substantially single-crystal component may include a plurality of low angle grain boundaries. According to embodiments, the storage node contact BC may include the first storage node contact BC1 which is single-crystal, and thus it is possible to prevent the bit line BL and the bit line contact DC from being damaged in a process of forming the storage node contact BC. This will be described later in detail in a method of manufacturing a semiconductor memory device.

The second storage node contact BC2 may be disposed on the first storage node contact BC1. The second storage node contact BC2 may be in contact with a top surface of the first storage node contact BC1. The second storage node contact BC2 may have a substantially uniform width. An interface IF between the first storage node contact BC1 and the second storage node contact BC2 may be located at a level between a bottom surface and a top surface of the bit line contact DC. In addition, the interface IF between the first storage node contact BC1 and the second storage node contact BC2 may be located at a higher level than a bottom surface of the poly-silicon pattern 130 of the bit line BL (FIG. 2). A top surface of the second storage node contact BC2 may be located at a lower level than a top surface of the bit line BL. The second storage node contact BC2 may be formed of the same material as the first storage node contact BC1. In an implementation, the second storage node contact BC2 may include silicon (Si). For example, a crystallinity of the second storage node contact BC2 may be different from a crystallinity of the first storage node contact BC1. The term 'crystallinity' means a degree to which a material is crystalline, and means a degree of defects in a crystal lattice. The crystallinity of the first storage node contact BC1 may be better, e.g., higher, than the crystallinity of the second storage node contact BC2. For example, the second storage node contact BC2 may include poly-crystal silicon (i.e., poly-silicon), e.g., the second storage node contact BC2 may include poly-silicon with lower crystallinity than a single-crustal silicon of the first storage node contact BC1. In the present specification, the term 'poly-crystal' means that many fine single-crystal grains (i.e., fine crystal grains) having different orientations exist in an inseparable state in a solid (e.g., a lump-type solid, a particle-type solid or a powder-type solid). A size of the fine crystal grain and a uniform state of the orientation of the fine crystal grain (i.e., a degree of the orientation of the fine crystal grain) are not particularly limited. In another example, the crystallinity of the second storage node contact BC2 may be the same or similar to the crystallinity of the first storage node contact BC1, e.g., the second storage node contact BC2 may include single-crystal silicon (Si).

A width of the first storage node contact BC1 may be equal to a width of the second storage node contact BC2 at the interface IF of the first storage node contact BC1 and the second storage node contact BC2. A maximum width of the first storage node contact BC1 may be equal to or greater than a maximum width of the second storage node contact BC2. The first storage node contact BC1, e.g., a portion of the first storage node contact BC1 protruding into the second dopant region 112b, may have a first sidewall opposing the bit line contact DC. The second storage node contact BC2 may have a second sidewall opposing the bit line contact DC. The first sidewall of the first storage node contact BC1 may be located farther from the bit line contact DC than the second sidewall of the second storage node contact BC2. For example, as illustrated in FIG. 3, a distance (e.g., along the second direction X2 in FIG. 2) between the bit line contact DC and a closest facing sidewall of the second storage node contact BC2 may be smaller than a distance (e.g., along the second direction X2) between the bit line contact DC and a facing sidewall of the portion of the first storage node contact BC1 that protrudes into the second dopant region 112b and the device isolation pattern 102.

For example, as illustrated in FIG. 3, the interface IF between the first storage node contact BC1 and the second storage node contact BC2 may be located at the level between the bottom surface and the top surface of the bit line contact DC. In another example, as illustrated in FIG. 4, the interface IF between the first storage node contact BC1 and the second storage node contact BC2 may be located at a substantially same level as the top surface of the bit line contact DC. In yet another example, the interface IF between the first storage node contact BC1 and the second storage node contact BC2 may be located at a level higher than the top surface of the bit line contact DC and lower than the top surface of the bit line BL.

Referring again to FIGS. 1 and 2, a bit line spacer may be disposed between the bit line BL and the storage node contact BC. The bit line spacer may include a first spacer 121 and a second spacer 125 which are spaced apart from each other, e.g., along the second direction X2, by an air gap. The first spacer 121 may cover a sidewall of the bit line BL and a sidewall of the bit line capping pattern 137. The second spacer 125 may be adjacent to the storage node contact BC. The first spacer 121 and the second spacer 125 may include the same material. In an implementation, the first spacer 121 and the second spacer 125 may include silicon nitride. A height of a top end of the second spacer 125 may be lower than a height of a top end of the first spacer 121. As a result, a margin of a process of forming a landing pad LP to be described later may be increased, and thus connection failure between the landing pad LP and the storage node contact BC may be prevented. The first spacer 121 may extend to cover a sidewall of the bit line contact DC and a sidewall and a bottom surface of the first recess region R1.

A storage node ohmic layer 109 may be disposed on the storage node contact BC. The storage node ohmic layer 109 may include a metal silicide. A diffusion barrier pattern 111a may cover the storage node ohmic layer 109, the first and second spacers 121 and 125, and the bit line capping pattern 137. The diffusion barrier pattern 111a may include a metal nitride, e.g., titanium nitride (TiN) or tantalum nitride (TaN).

Landing pads LP may be disposed on the diffusion barrier patterns 111a, respectively. An upper portion of each of the landing pads LP may cover a top surface of the bit line capping pattern 137. A portion of each of the landing pads LP may extend between the bit lines BL so as to be connected to the storage node contact BC. The landing pads LP on the storage node contacts BC may have widths greater than those of the storage node contacts BC. A center of the landing pad LP may be shifted from a center of the storage node contact BC in the second direction X2, as illustrated in FIG. 1. A portion of the bit line BL may vertically overlap with the landing pad LP. One sidewall of an upper portion of the bit line capping pattern 137 may overlap with the landing pad LP. A second recess region R2 may be formed at another sidewall of the upper portion of the bit line capping pattern 137. The landing pad LP may include a metal-containing material, e.g., tungsten (W).

A first capping pattern 158a may be provided between adjacent landing pads LP.

The first capping pattern 158a may have a liner shape, and a space surrounded thereby may be filled with a second capping pattern 160a. Each of the first and second capping patterns 158a and 160a may independently include, e.g., a silicon nitride layer, a silicon oxide layer, a silicon oxynitride layer, or a porous layer. A porosity of the first capping pattern 158a may be greater than a porosity of the second capping pattern 160a.

A pad separation pattern 156a may be disposed between the landing pads LP.

The pad separation pattern 156a may include, e.g., a silicon nitride layer, a silicon oxide layer, a silicon oxynitride layer, or a porous layer. The pad separation pattern 156a may define a top end of the air gap provided between the first spacer 121 and the second spacer 125.

Lower electrodes BE may be disposed on the landing pads LP, respectively.

Each of the lower electrodes BE may include, e.g., at least one of a poly-silicon layer doped with dopants, a metal nitride layer, or a metal layer. In an implementation, the metal nitride layer may include, e.g., a titanium nitride layer. In an implementation, the metal layer may include, e.g., tungsten (W), aluminum (Al), or copper (Cu). Each of the lower electrodes BE may have a solid cylinder shape or a hollow cylinder or cup shape. A support pattern 174a supporting the lower electrodes BE may be provided between adjacent lower electrodes BE. The support pattern 174a may include an insulating material, e.g., silicon nitride (SiN), silicon oxide (SiO), and/or silicon oxynitride (SiON).

An etch stop layer 170 covering the first and second capping patterns 158a and 160a may be provided between the lower electrodes BE. In an implementation, the etch stop layer 170 may include an insulating material, e.g., silicon nitride (SiN), silicon oxide (SiO), and/or silicon oxynitride (SiON).

A dielectric layer DL may cover surfaces of the lower electrode BE, the support pattern 174a, and the etch stop layer 170. The dielectric layer DL may include, e.g., at least one of silicon oxide (SiO), silicon nitride (SiN), silicon oxynitride (SiON), or a high-k dielectric material.

An interface layer IFb may be provided between the dielectric layer DL and the lower electrode BE. The interface layer IFb may include niobium (Nb), titanium (Ti), oxygen (O) and/or nitrogen (N), and may further include a metal component, e.g., zirconium (Zr) or hafnium (Hf). The metal component, e.g., zirconium (Zr) or hafnium (Hf), may be a component of the dielectric layer DL.

An upper electrode TE may cover the dielectric layer DL. The upper electrode TE may include, e.g., at least one of a poly-silicon layer doped with dopants, a silicon-germanium layer doped with dopants, a metal nitride layer, or a metal layer. In an implementation, the metal nitride layer may include, e.g., a titanium nitride layer. In an implementation, the metal layer may include, e.g., tungsten, aluminum, or copper.

The lower electrode BE, the interface layer IFb, the dielectric layer DL and the upper electrode TE may constitute a capacitor CAP. Thus, a semiconductor memory device including the capacitor CAP may be provided.

FIGS. 5 to 23 are cross-sectional views of stages in a method of manufacturing a semiconductor memory device, according to some example embodiments.

Figure 5:
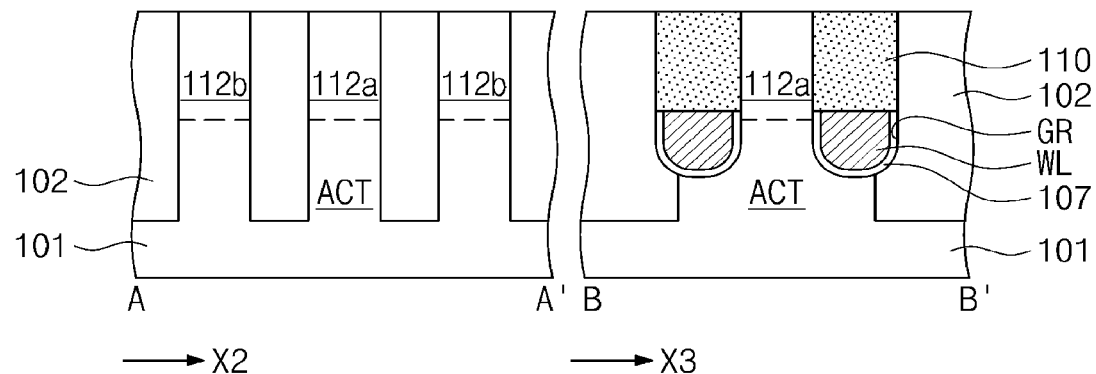
FIGS. 5 to 23 are cross-sectional views of stages in a method of manufacturing a semiconductor memory device, according to some example embodiments.

Referring to FIGS. 1 and 5, the device isolation pattern 102 may be formed in the substrate 101 to define the active regions ACT. In an implementation, a trench may be formed in the substrate 101, and the device isolation pattern 102 may be formed by filling the trench with an insulating material. The grooves GR may be formed by etching the active regions ACT and the device isolation pattern 102. A bottom surface of each of the grooves GR may be curved and/or uneven.

The word lines WL may be formed in the grooves GR, respectively. The word lines WL may intersect the active regions ACT. Before the formation of the word lines WL, the gate dielectric layer 107 may be formed on an inner surface of each of the grooves GR. The gate dielectric layer 107 may be formed by, e.g., a thermal oxidation process, a chemical vapor deposition (CVD) process, and/or an atomic layer deposition (ALD) process. A conductive layer may be formed on the substrate 101 to fill the grooves GR, and an etch-back process or a chemical mechanical polishing (CMP) process may be performed on the conductive layer to form the word lines WL in the grooves GR. Top surfaces of the word lines WL may be recessed to be lower than top surfaces of the active regions ACT. An insulating layer, e.g., a silicon nitride layer, may be formed on the substrate 101 to fill the grooves GR, and a planarization process may be performed on the insulating layer to form word line capping patterns 110 on the word lines WL, respectively.

Dopants may be injected or implanted into the active regions ACT by using the word line capping patterns 110 and the device isolation pattern 102 as masks. Thus, the first and second dopant regions 112a and 112b may be formed in the active regions ACT. The first and second dopant regions 112a and 112b may have a different conductivity type from that of the substrate 101. In an implementation, when the substrate 101 has P-type dopants, the first and second dopant regions 112a and 112b may have N-type dopants.

Figure 6:
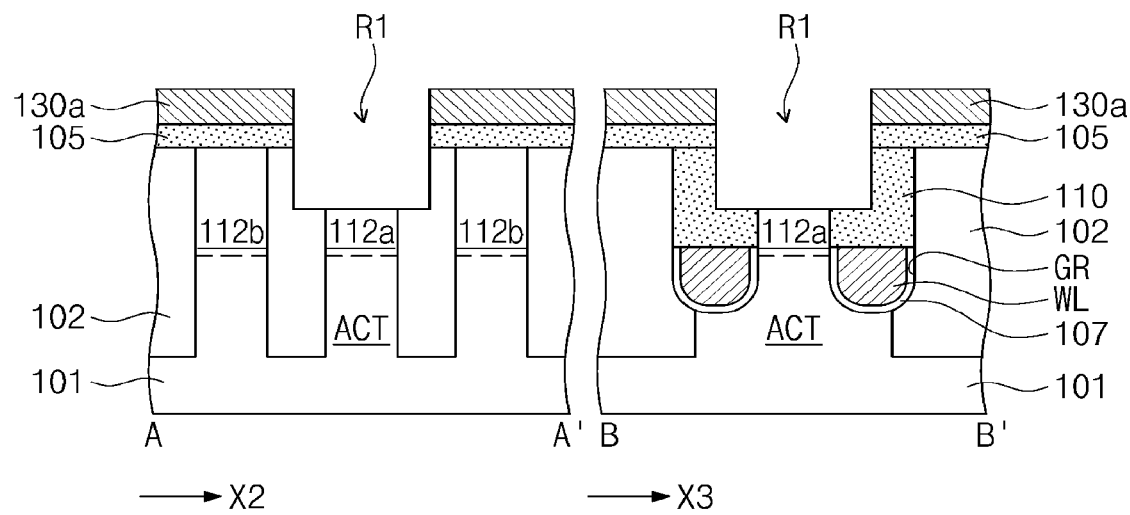

Referring to FIGS. 1 and 6, the interlayer insulating pattern 105 and a poly-silicon mask pattern 130a may be formed on the substrate 101. In an implementation, an insulating layer and a first poly-silicon layer may be sequentially formed on the substrate 101. The poly-silicon mask pattern 130a may be formed by patterning the first poly-silicon layer. The insulating layer, the device isolation pattern 102, the substrate 101, and the word line capping patterns 110 may be etched using the poly-silicon mask pattern 130a as an etch mask, thereby forming the first recess region R1 and the interlayer insulating pattern 105. The interlayer insulating pattern 105 may have a plurality of island shapes spaced apart from each other. The first recess region R1 may have a mesh shape when viewed in a plan view. The first recess region R1 may expose the first dopant regions 112a.

Figure 7:
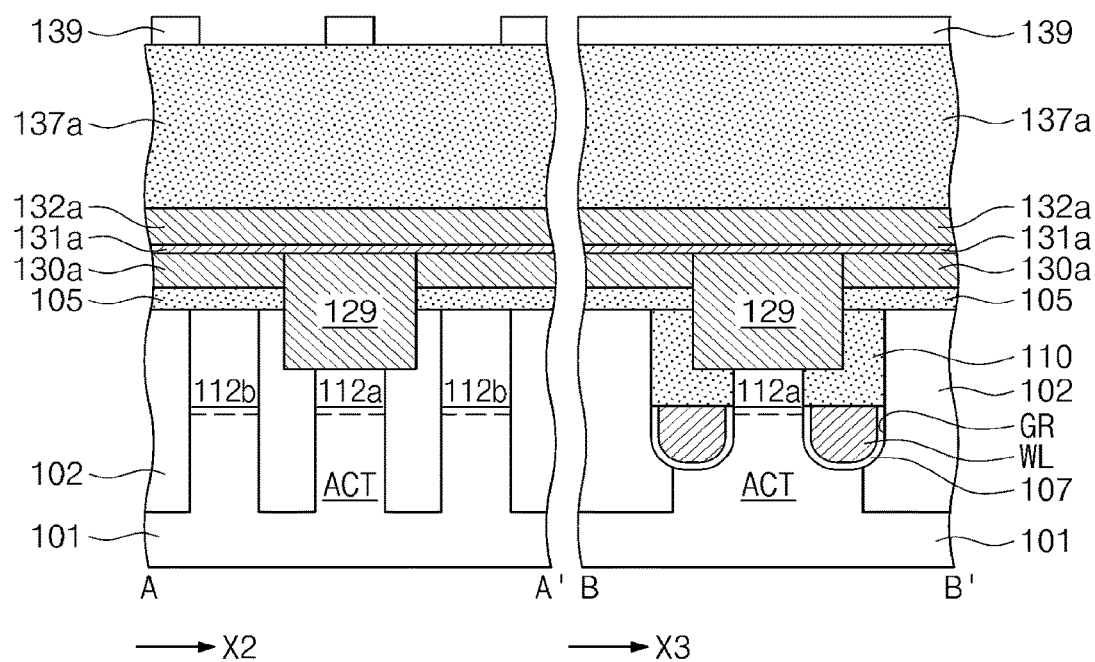

Referring to FIGS. 1 and 7, a second poly-silicon layer 129 may be formed on the substrate 101 to fill the first recess region R1. Thereafter, a planarization process may be performed on the second poly-silicon layer 129 to remove a portion of the second poly-silicon layer 129, which is located on the poly-silicon mask pattern 130a. The poly-silicon mask pattern 130a may be exposed after the planarization process.

An ohmic layer 131a, a metal-containing layer 132a, and a capping layer 137a may be sequentially formed on the poly-silicon mask pattern 130a and the second poly-silicon layer 129. The ohmic layer 131a may be formed of a metal silicide, e.g., cobalt silicide ($CoSi_2$). In an implementation, a metal layer may be deposited on the poly-silicon mask pattern 130a and the second poly-silicon layer 129, and then, a thermal treatment process may be performed to form the ohmic layer 131a. In the thermal treatment process, the metal layer may react with the poly-silicon mask pattern 130a and the second poly-silicon layer 129, thereby forming a metal silicide. A portion of the metal layer, which is not reacted in the thermal treatment process, may be removed.

First mask patterns 139 may be formed on the capping layer 137a. The first mask patterns 139 may be used as etch masks for defining planar shapes of bit lines BL in a subsequent process. The first mask patterns 139 may extend in the third direction X3.

Figure 8:
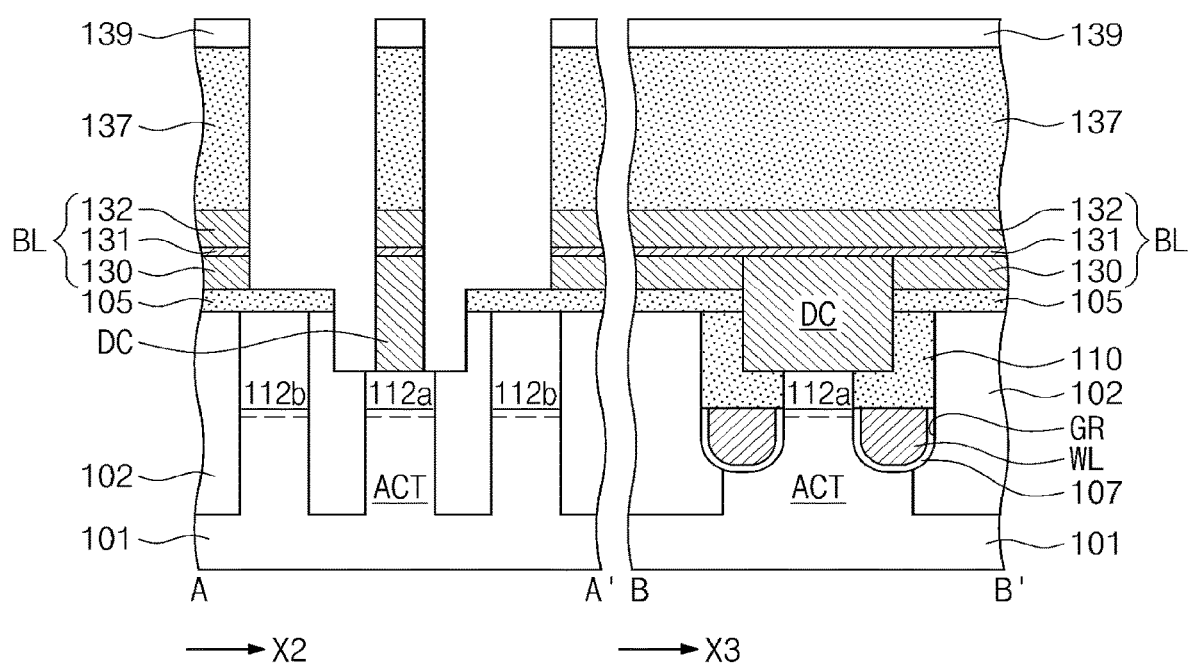

Referring to FIGS. 1 and 8, the capping layer 137a, the metal-containing layer 132a, the ohmic layer 131a, the poly-silicon mask pattern 130a, and the second poly-silicon layer 129 may be sequentially etched to form the bit line capping pattern 137, the bit line BL, and the bit line contact DC. The etching process may be performed using the first mask patterns 139 as etch masks. The bit line BL may include the poly-silicon pattern 130, the ohmic pattern 131, and the metal-containing pattern 132. A top surface of the interlayer insulating pattern 105 and an inner sidewall and a bottom surface of the first recess region R1 may be partially exposed by the etching process. The first mask patterns 139 may be removed after the formation of the bit line BL and the bit line contact DC.

Figure 9:
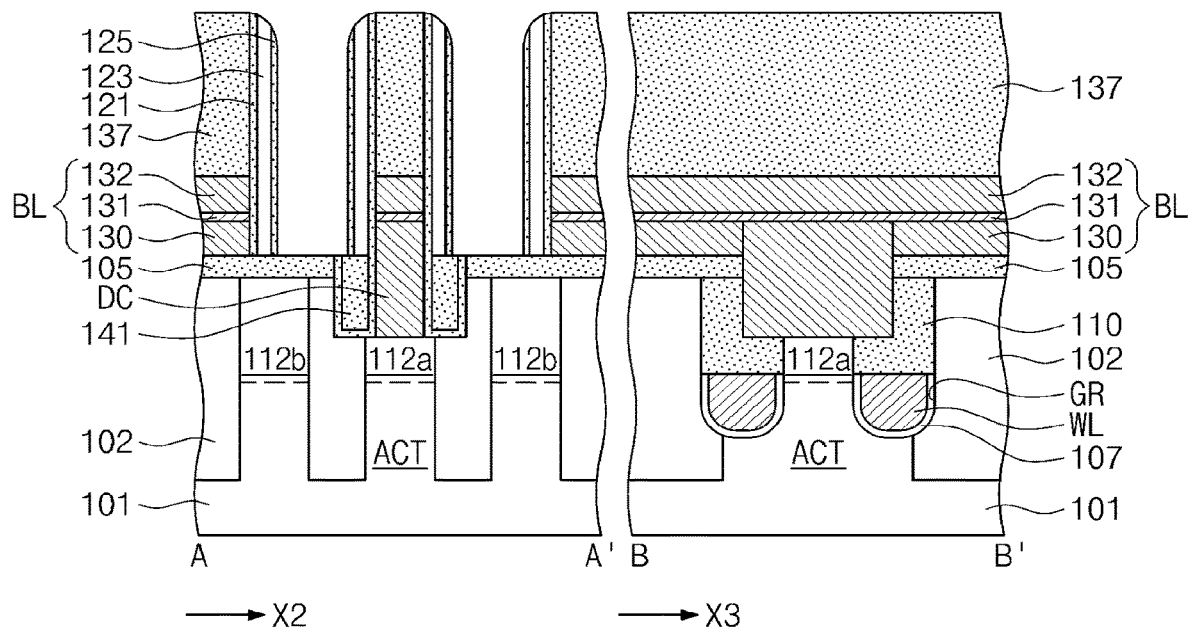

Referring to FIGS. 1 and 9, a first spacer layer may be conformally formed on the substrate 101. The first spacer layer may conformally cover the bottom surface and the inner sidewall of the first recess region R1. The first spacer layer may be a silicon nitride layer. Thereafter, an insulating layer (e.g., a silicon nitride layer) may be formed on the substrate 101 to fill the first recess region R1, and an anisotropic etching process may be performed on the insulating layer to leave a filling insulation pattern 141 in the first recess region R1. At this time, the first spacer layer may also be etched by the anisotropic etching process, and thus the first spacer 121 may be formed.

A sacrificial spacer layer may be conformally formed on the substrate 101, and then, an anisotropic etching process may be performed on the sacrificial spacer layer to form a sacrificial spacer 123 covering a sidewall of the first spacer 121. The sacrificial spacer 123 may be formed of a material having an etch selectivity with respect to the first spacer 121. In an implementation, the sacrificial spacer 123 may be formed of a silicon oxide layer.

The second spacer 125 may be formed to cover a sidewall of the sacrificial spacer 123. In an implementation, a second spacer layer may be conformally formed on the substrate 101, and then, an anisotropic etching process may be performed on the second spacer layer to form the second spacer 125. In an implementation, the second spacer 125 may be formed of a silicon nitride layer.

Figure 10:
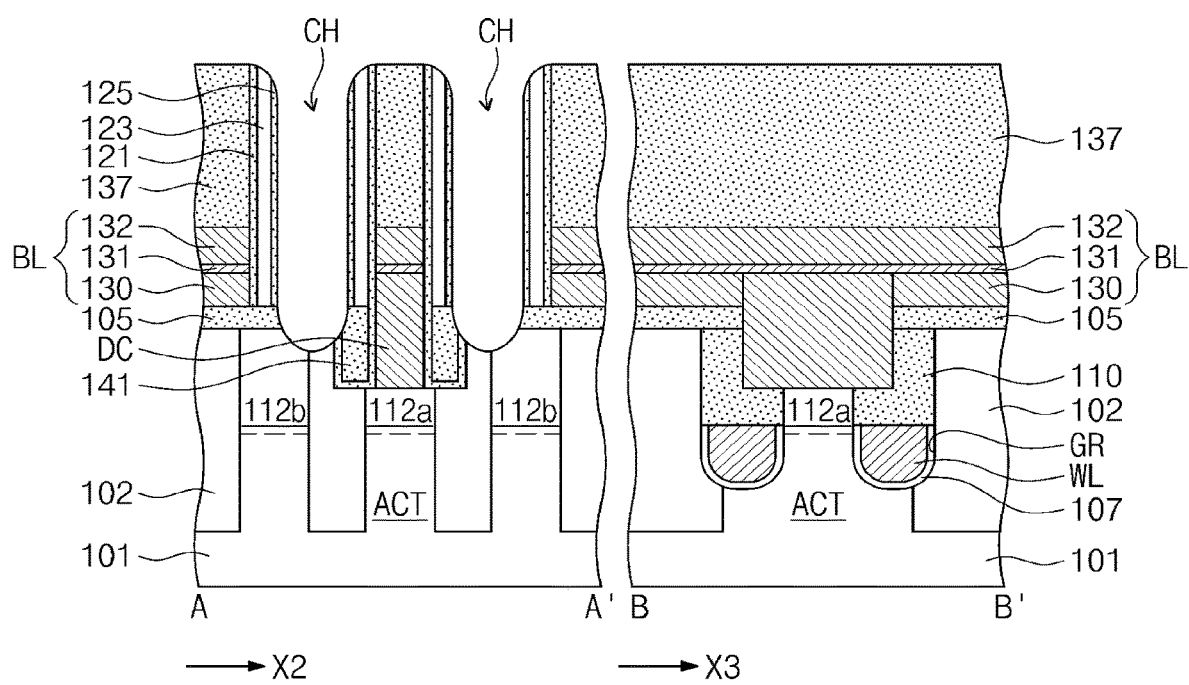

Referring to FIGS. 1 and 10, the second dopant region 112b may be exposed. For example, after the formation of the second spacer 125, the interlayer insulating pattern 105 between the bit lines BL may be etched to form a contact hole CH. At this time, portions of the second dopant region 112b and the device isolation pattern 102 may also be etched. For example, as illustrated in FIG. 10, a portion of the interlayer insulating pattern 105 between facing surfaces of the second spacer 125 may be completely removed, and upper corner portions of the second dopant region 112b and the device isolation pattern 102 (e.g., portions directly under the removed portion of the interlayer insulating pattern 105) may also be removed, thereby exposing the second dopant region 112b through the contact hole CH. The etching process of the interlayer insulating pattern 105 may be performed by an additional etching process after the formation of the second spacer 125. Alternatively, the interlayer insulating pattern 105 may be etched together in the anisotropic etching process for forming the second spacer 125.

In another example, the second dopant region 112b may be exposed after the formation of the sacrificial spacer 123. In an implementation, after the formation of the sacrificial spacer 123, the interlayer insulating pattern 105 between the bit lines BL may be etched to form the contact hole CH. At this time, portions of the second dopant region 112b and the device isolation pattern 102 may also be etched. Thereafter, the second spacer 125 may be formed. In this case, the second spacer 125 may cover a sidewall of the interlayer insulating pattern 105 exposed in the contact hole CH. Hereinafter, the embodiments of FIG. 10 will be described continuously as examples.

Figure 11:
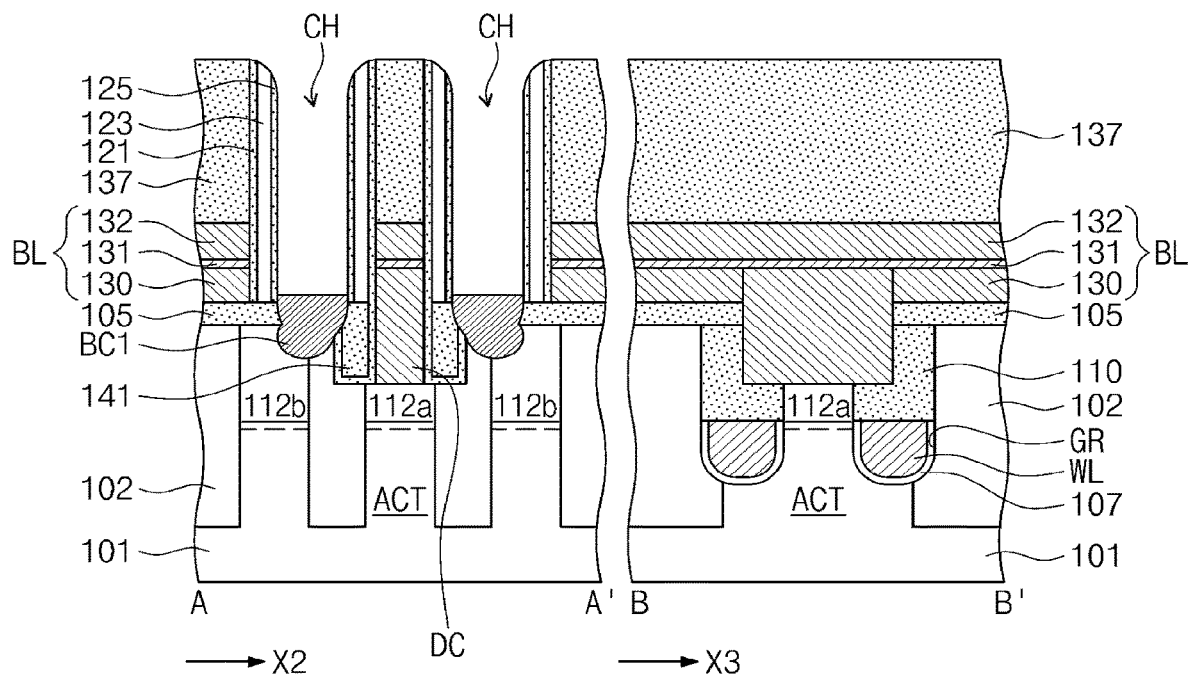

Referring to FIGS. 1 and 11, first storage node contacts BC1 may be formed in the contact holes CH, respectively. In detail, the first storage node contacts BC1 may be grown from the second dopant regions 112b (i.e., from the exposed portion of the second dopant region 112b described with reference to FIG. 10) by performing a selective epitaxial growth (SEG) process using the second dopant regions 112b exposed through the contact holes CH as a seed. For example, referring to FIG. 11, the first storage node contacts BC1 may be grown to completely fill the bottom of the contact holes CH, respectively, so the first storage node contacts BC1 may completely fill cavities in the upper corner portions of the second dopant region 112b and the device isolation pattern 102 (cavities previously formed as described with reference to FIG. 10). The first storage node contact BC1 may include single-crystal silicon (Si). A top surface of the first storage node contact BC1 may be located at a level between a bottom surface and a top surface of the bit line contact DC, e.g., the first storage node contacts BC1 may be grown until the upper surfaces are higher than the interlayer insulating pattern 105.

Figure 12:
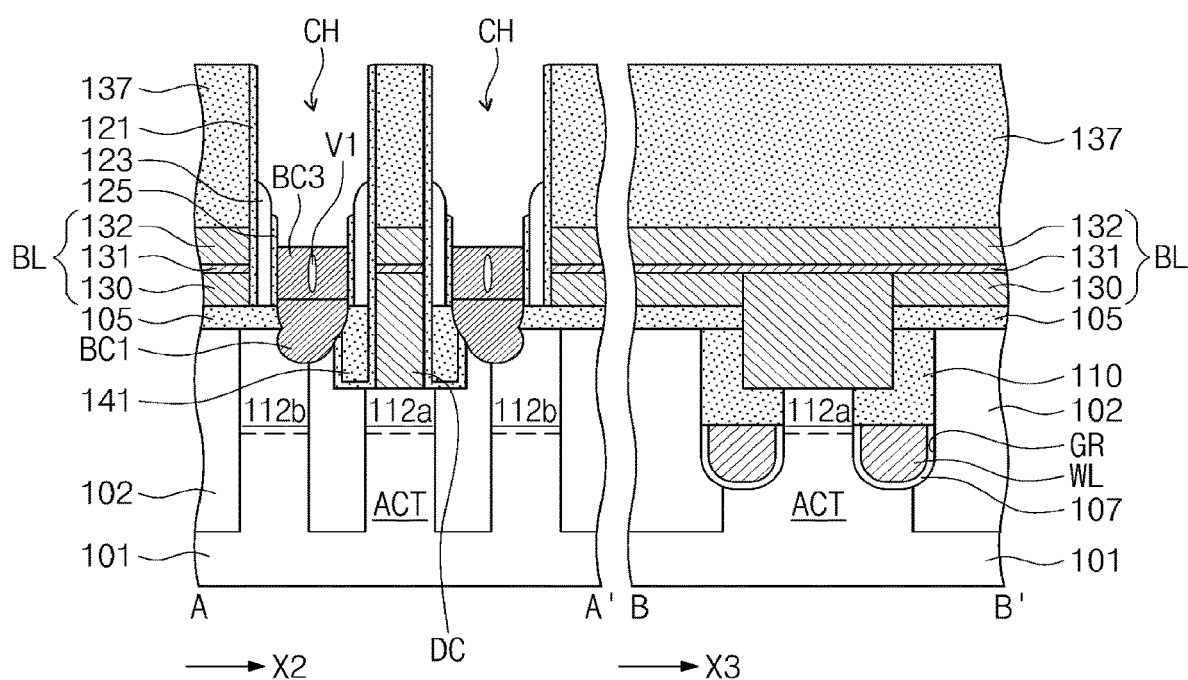

Referring to FIGS. 1 and 12, a third storage node contact BC3 may be formed on the first storage node contact BC1. In an implementation, an amorphous silicon layer or a poly-silicon layer may be formed on the first storage node contact BC1, and then may be etched to form the third storage node contact BC3 which has a top surface lower than the bit line capping pattern 137 between the second spacers 125 adjacent to each other. In the present embodiments, the term 'amorphous' means a phase in which crystals are not formed in a solid (i.e., a phase which does not have regular arrangement of atoms like a crystal phase).

Thereafter, an etching process may be performed to remove portions of the second spacer 125 and the sacrificial spacer 123, sidewalls of which are not covered by the third storage node contact BC3, and to expose a sidewall of an upper portion of the first spacer 121. Thus, the upper portion of the first spacer 121 may be exposed. This process may increase a process margin when forming the landing pad LP to be described later. When upper portions of the sacrificial spacer 123 and the second spacer 125 are removed, the upper portion of the first spacer 121 may also be partially removed, and thus a width of the first spacer 121 may be reduced.

When the amorphous silicon layer or the poly-silicon layer is formed, the probability of occurrence of a seam or void V1 may increase as a distance between the second spacers 125 decreases. If the void V1 were to remain in the third storage node contact BC3 as described above, an internal resistance of the third storage node contact BC3 would have been increased to deteriorate electrical characteristics of the semiconductor memory device. In addition, the probability of occurrence of a crack in the third storage node contact BC3 would have increased, thereby deteriorating structural stability of the semiconductor memory device. To prevent these limitations, the following processes may be performed.

Figure 13:
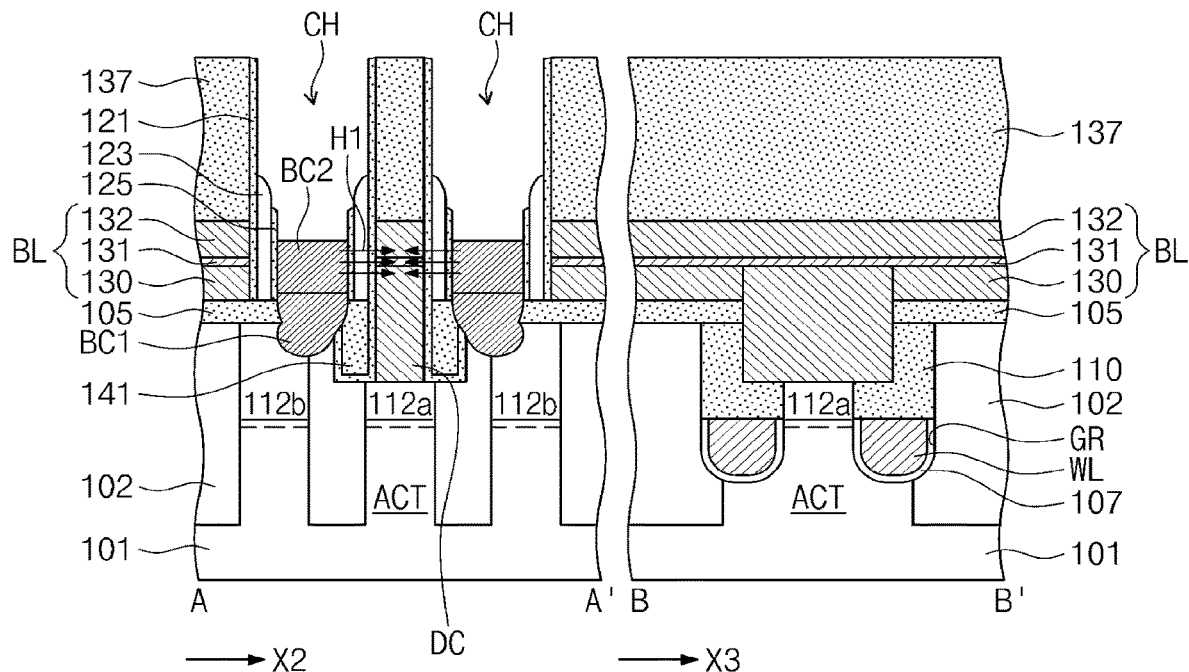

Referring to FIGS. 1 and 13, a thermal treatment process may be performed on the third storage node contact BC3. In an implementation, laser may be irradiated onto the third storage node contact BC3. The third storage node contact BC3 may be melted or recrystallized by the thermal treatment process, and thus the second storage node contact BC2 may be formed. The void V1 in the third storage node contact BC3 may be removed by the melting or recrystallization of the third storage node contact BC3. The second storage node contact BC2 formed by the recrystallization of the third storage node contact BC3 may be formed of poly-crystal silicon (i.e., poly-silicon).

When the thermal treatment process is performed on the third storage node contact BC3, a portion H1 of heat generated from the third storage node contact BC3 may be transferred to the bit line contact DC. According to embodiments, a lower portion of the storage node contact BC, i.e., the first storage node contact BC1 formed of single-crystal silicon, may not include voids, and therefore, may not require a thermal treatment process. As a result, the thermal treatment process may be performed only on the third storage node contact BC3 corresponding to an upper portion of the storage node contact, e.g., by adjusting laser operation time or visual inspection, and thus the amount of the heat H1 transferred from the storage node contact to the bit line contact DC may be reduced, e.g., as compared to a case where both the upper and lower portions of the storage node contact are treated thermally. In other words, a region in which the third storage node contact BC3 overlaps with the bit line contact DC in the second direction X2 may be small, and the amount of the heat H1 transferred from the third storage node contact BC3 to the bit line contact DC may be small. In addition, the first storage node contact BC1 may include single-crystal silicon having high thermal conductivity, and thus the heat generated from the third storage node contact BC3 may be released or dissipated through the first storage node contact BC1. As a result, the amount of the heat H1 transferred from the storage node contact to the bit line contact DC may be further reduced. In other words, it is possible to prevent the bit line contact DC from being damaged in the thermal treatment process of the third storage node contact BC3.

Figure 14:
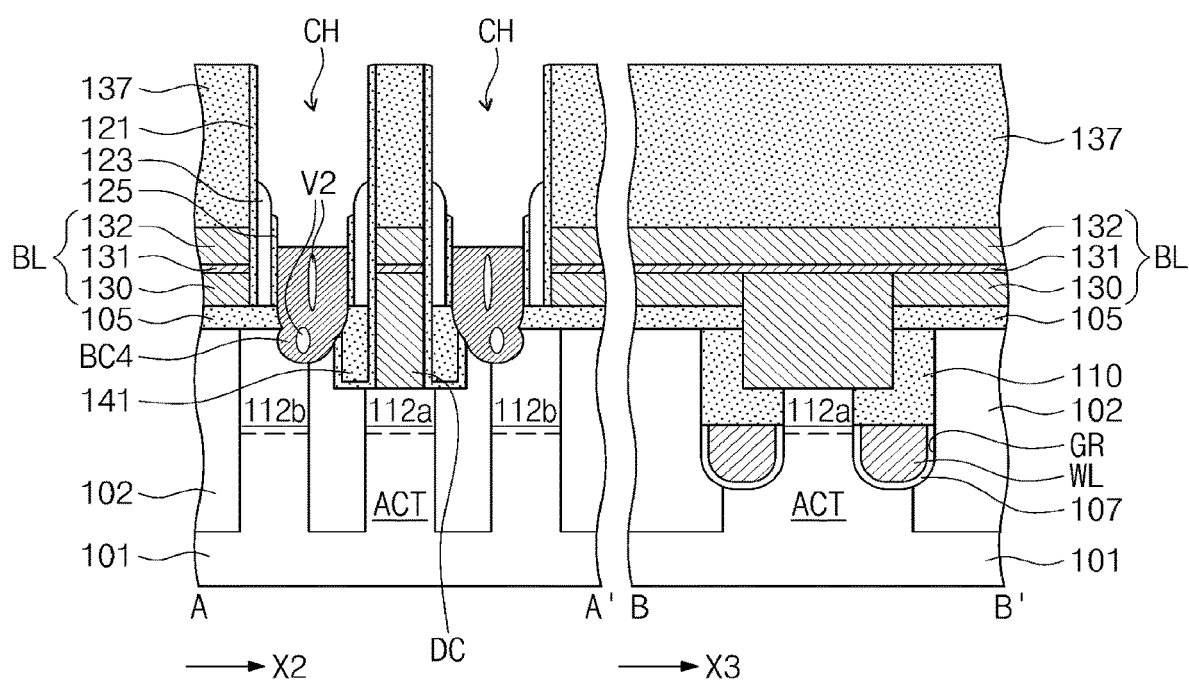
Figure 15:
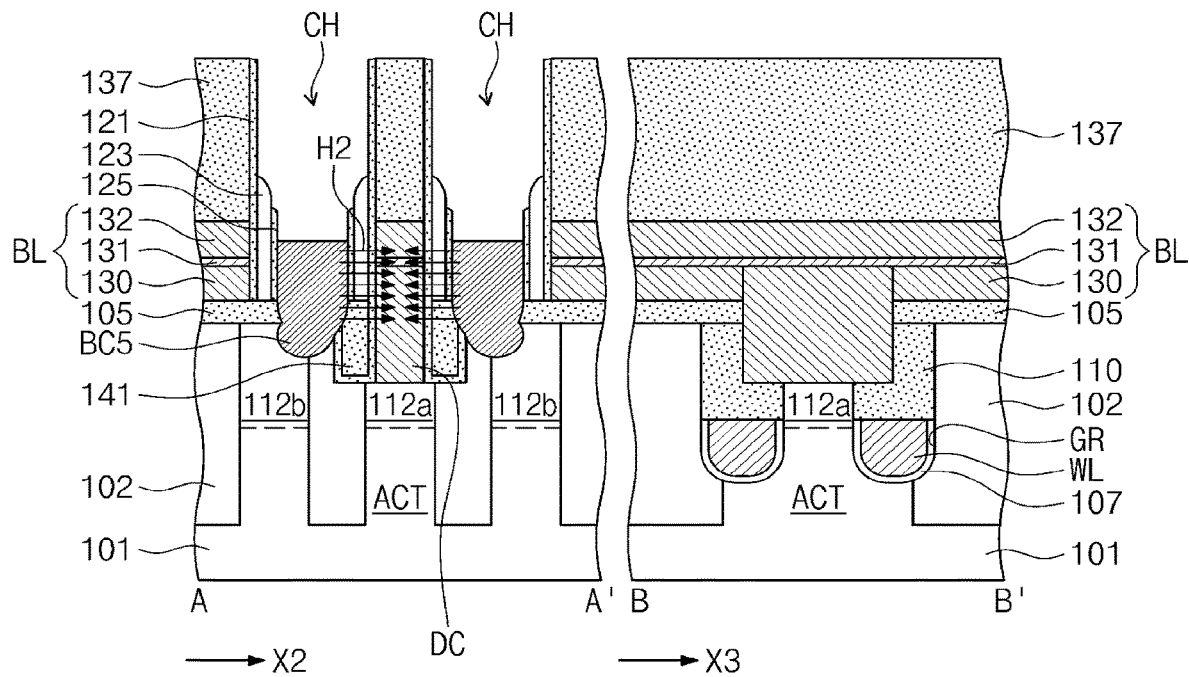

If the first storage node contact BC1 of single-crystal silicon is not formed, in a process of forming a storage node contact, the bit line contact DC may be damaged by heat and/or the probability of occurrence of a seam or void in the bit line contact DC may be increased. FIGS. 14 and 15 are views illustrating a comparative case in which the first storage node contact BC1 of single-crystal silicon is not formed but a storage node contact is formed of a single poly-silicon layer.

As illustrated in FIG. 14, a fourth storage node contact BC4 may be formed in the contact hole CH of the resultant structure of FIG. 10. In an implementation, an amorphous silicon layer or a poly-silicon layer may be formed on the second dopant region 112b exposed by the contact hole CH and then may be etched to form the fourth storage node contact BC4 which has a top surface lower than the bit line capping pattern 137 between the second spacers 125 adjacent to each other. The term 'amorphous' means a phase in which crystals are not formed in a solid (i.e., a phase which does not have regular arrangement of atoms like a crystal phase).

When the amorphous silicon layer or the poly-silicon layer is formed, the probability of occurrence of a seam or void V2 in the fourth storage node contact BC4 may increase as a distance between the second spacers 125 decreases. At this time, the voids V2 may occur throughout the inside of the fourth storage node contact BC4. In other words, the void V2 may also occur in a lower portion of the storage node contact (here, the whole of the fourth storage node contact BC4).

Referring to FIG. 15, a thermal treatment process may be performed on the, e.g., entire, fourth storage node contact BC4. In an implementation, laser may be irradiated onto the fourth storage node contact BC4. The fourth storage node contact BC4 may be melted or recrystallized by the thermal treatment process, and thus a fifth storage node contact BC5 may be formed. The void V2 in the fourth storage node contact BC4 may be removed by the melting or recrystallization of the fourth storage node contact BC4. The fifth storage node contact BC5 formed by the recrystallization of the fourth storage node contact BC4 may be formed of poly-crystal silicon (i.e., poly-silicon).

When the thermal treatment process is performed on the fourth storage node contact BC4, a portion H2 of heat generated from the fourth storage node contact BC4 may be transferred to the bit line contact DC. A region in which the fourth storage node contact BC4 overlaps with the bit line contact DC in the second direction X2 may be great, and the amount of the heat H2 transferred from the fourth storage node contact BC4 to the bit line contact DC may be great. The bit line contact DC formed of poly-silicon may be in contact with the ohmic pattern 131 (e.g., a metal silicide) or the metal-containing pattern 132 (e.g., a metal) provided on the bit line contact DC, and silicon (Si) atoms of the bit line contact DC may be diffused into the ohmic pattern 131 or the metal-containing pattern 132 by the heat H2. Thus, the amount of silicon (Si) atoms in the bit line contact DC may be reduced, and a seam or void may occur in the bit line contact DC.

However, according to embodiments, the region in which the third storage node contact BC3 overlaps with the bit line contact DC in the second direction X2 may be small or may not exist, and the amount of the heat H1 transferred from the third storage node contact BC3 to the bit line contact DC may be small. Diffusion of silicon (Si) atoms of the bit line contact DC may be reduced or minimized due to the small amount of the heat H1. Thus, a seam or void may not occur in the bit line contact DC. As a result, defects may be reduced or minimized in manufacturing of the semiconductor memory device, and the semiconductor memory device with improved structural stability may be manufactured.

The second storage node contact BC2 of poly-silicon is formed by performing the thermal treatment process on the third storage node contact BC3 in FIGS. 12 and 13. However, embodiments are not limited thereto. In certain embodiments, the second storage node contact BC2 formed by the recrystallization of the third storage node contact BC3 may be formed of single-crystal silicon, depending on a process time of the thermal treatment process performed on the third storage node contact BC3 (e.g., by performing the thermal treatment process for a long time). Hereinafter, the embodiments of FIG. 13 will be described continuously as examples.

Figure 16:
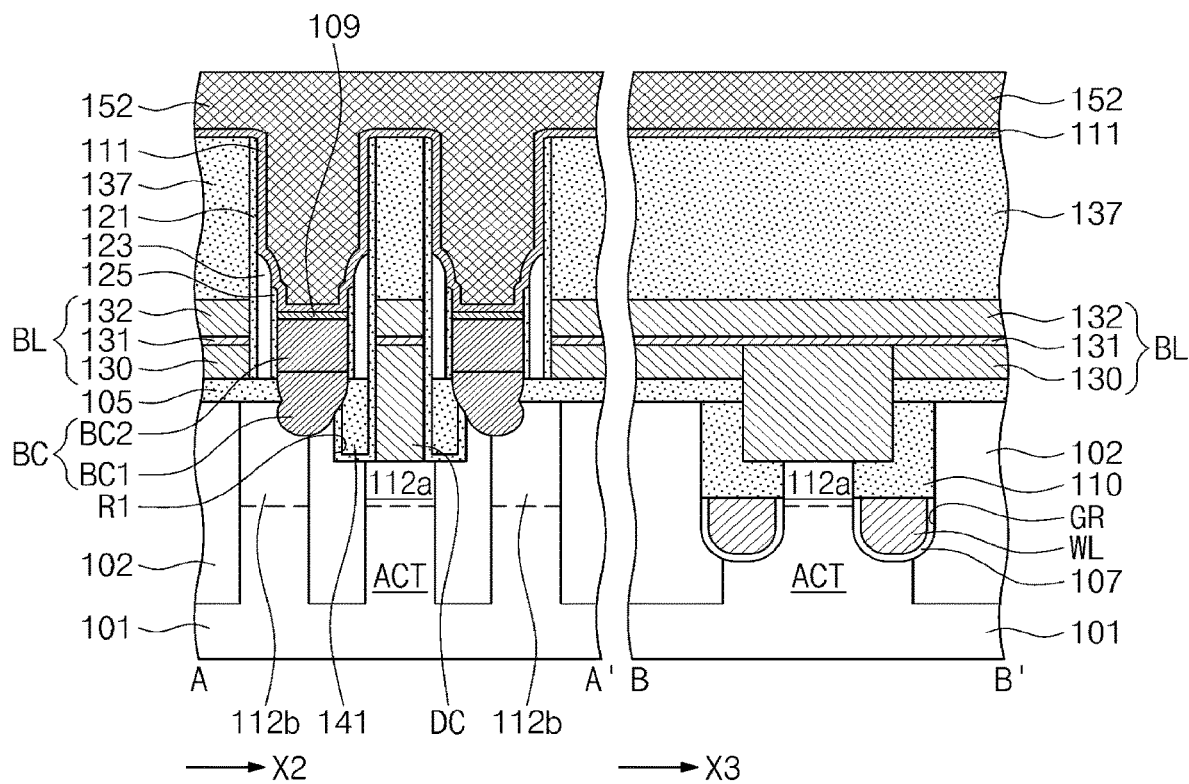

Referring to FIGS. 1 and 16, the ohmic layer 109 may be formed on the storage node contact BC of the resultant structure of FIG. 13, and the diffusion barrier layer 111 may be conformally formed on the substrate 101. A landing pad layer 152 may be formed on the substrate 101 to fill a space between the bit line capping patterns 137. The landing pad layer 152 may include, e.g., tungsten (W).

Figure 17:
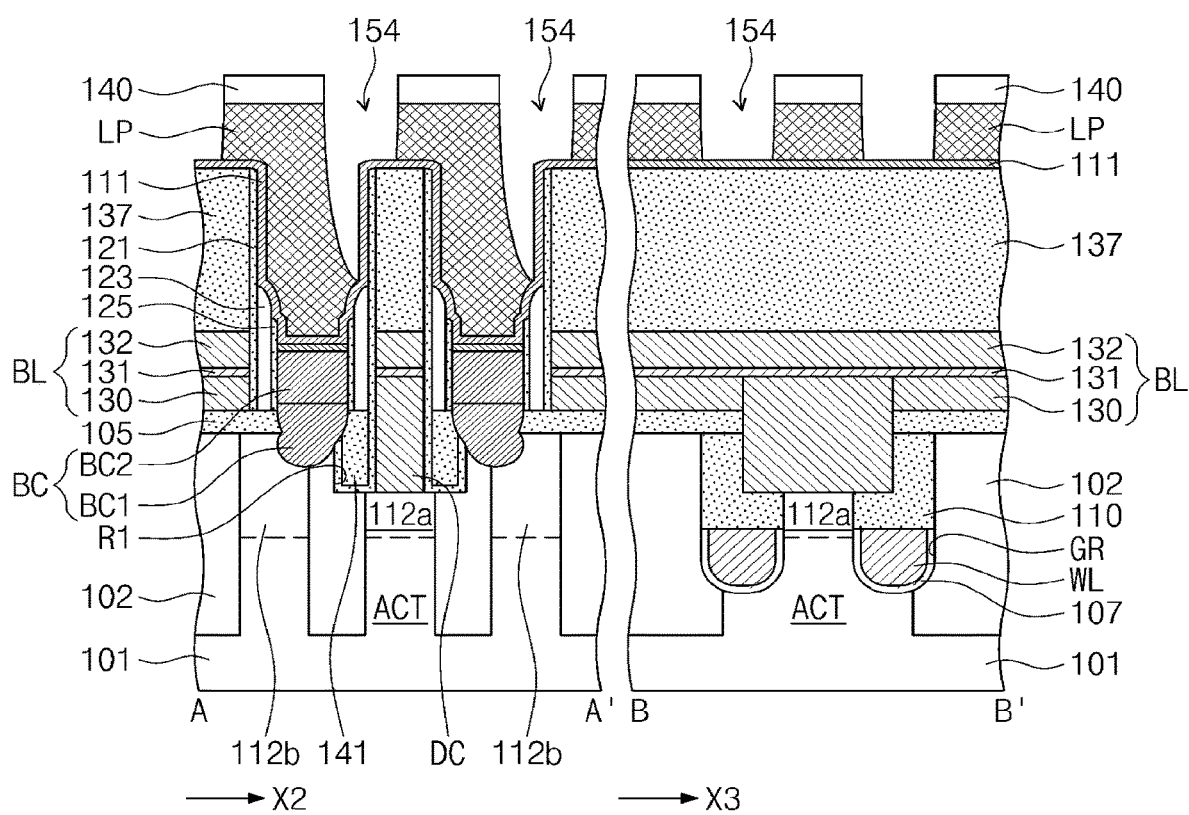

Referring to FIGS. 1 and 17, second mask patterns 140 may be formed on the landing pad layer 152. The second mask patterns 140 may be formed of an amorphous carbon layer (ACL). The second mask patterns 140 may be mask patterns for defining positions of landing pads LP to be described later. The second mask patterns 140 may vertically overlap with the storage node contacts BC.

An anisotropic etching process may be performed using the second mask patterns 140 as etch masks to remove a portion of the landing pad layer 152. Thus, the landing pad layer 152 may be divided to form landing pads LP, and openings 154 exposing the diffusion barrier layer 111 may be formed.

Figure 18:
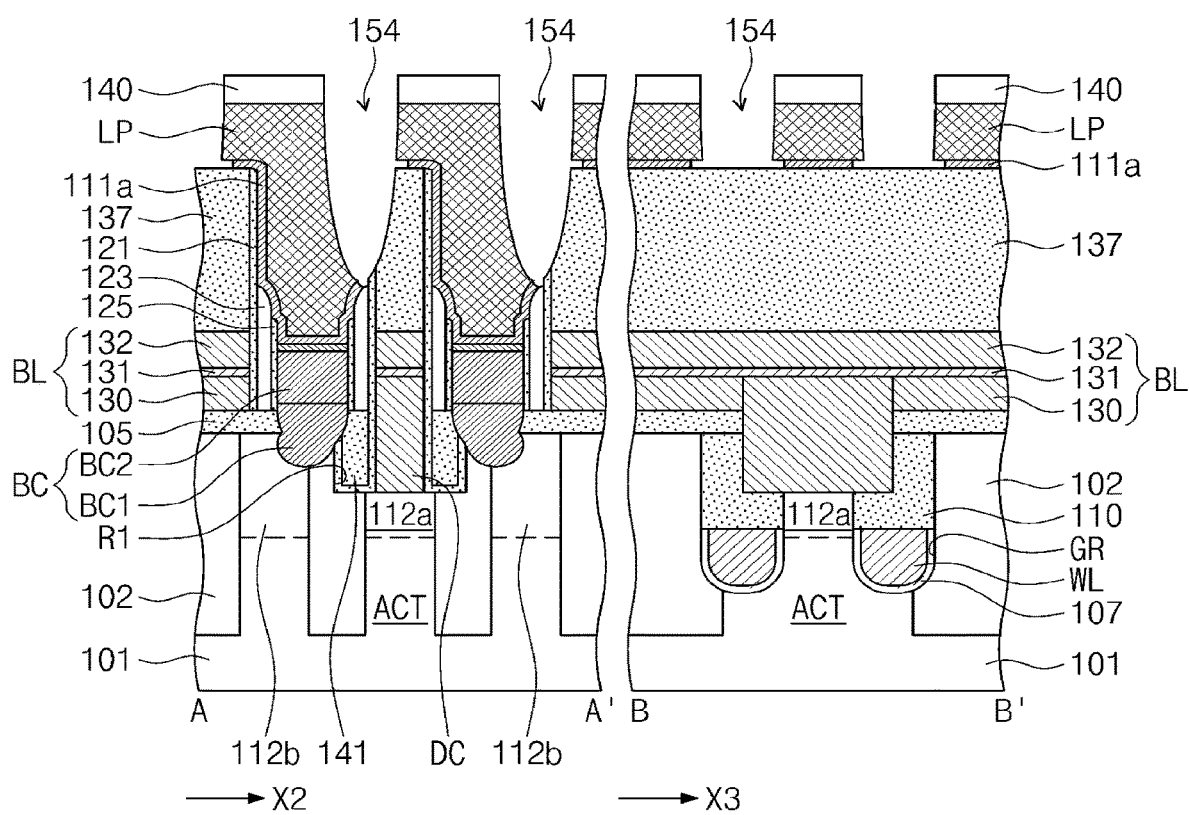

Referring to FIGS. 1 and 18, an isotropic etching process may be performed to pattern the diffusion barrier layer 111 exposed by the openings 154. The diffusion barrier layer 111 may be patterned to form diffusion barrier patterns 111a separated from each other. Portions of top surfaces of the bit line capping patterns 137 and the first spacers 121 may be exposed after the isotropic etching process. The diffusion barrier patterns 111a may be over-etched by the isotropic etching process, and thus bottom surfaces of the landing pads LP may be partially exposed.

Figure 19:
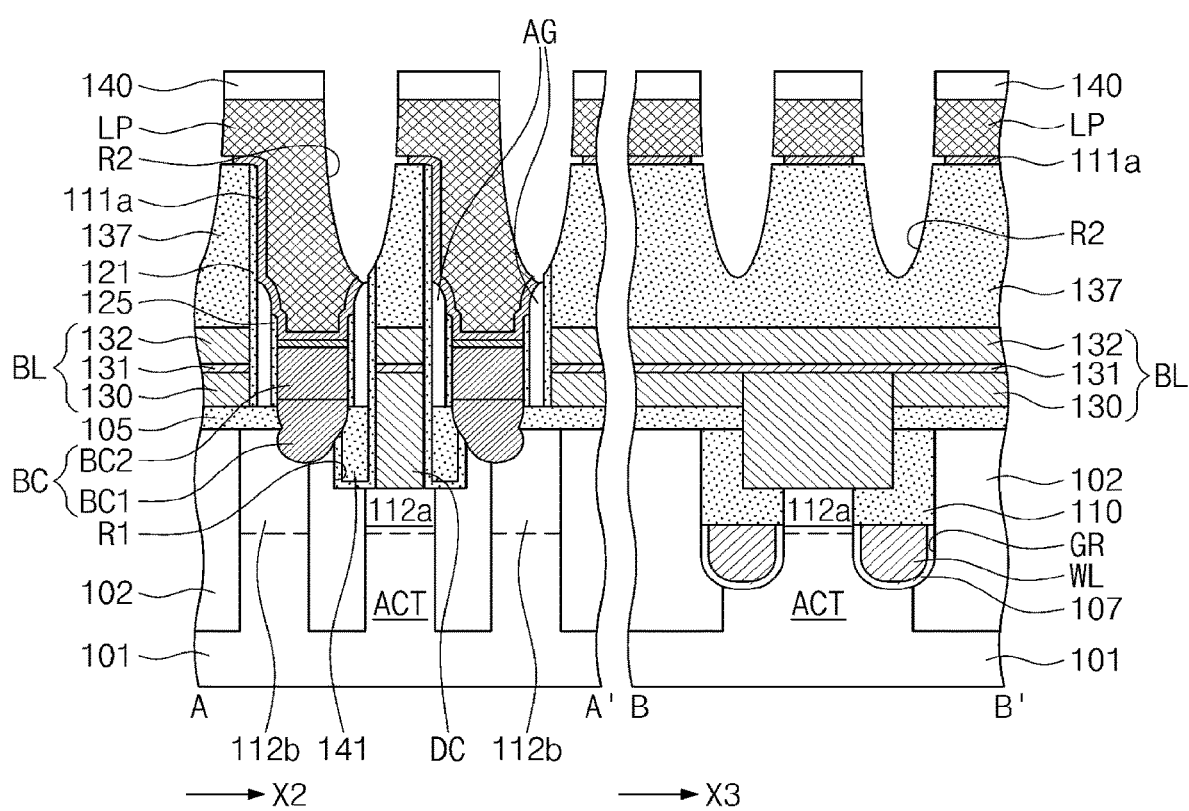

Referring to FIGS. 1 and 19, portions of the bit line capping patterns 137 and portions of the first spacers 121, which are exposed by the openings 154, may be removed by performing an anisotropic etching process, thereby exposing the sacrificial spacers 123. In this case, the second recess region R2 may be formed in upper portions of the bit line capping patterns 137.

An isotropic etching process may be performed to remove the sacrificial spacers 123. An air gap AG may be formed between the first spacer 121 and the second spacer 125 by the removal of the sacrificial spacer 123. Thereafter, the second mask patterns 140 may be removed.

Figure 20:
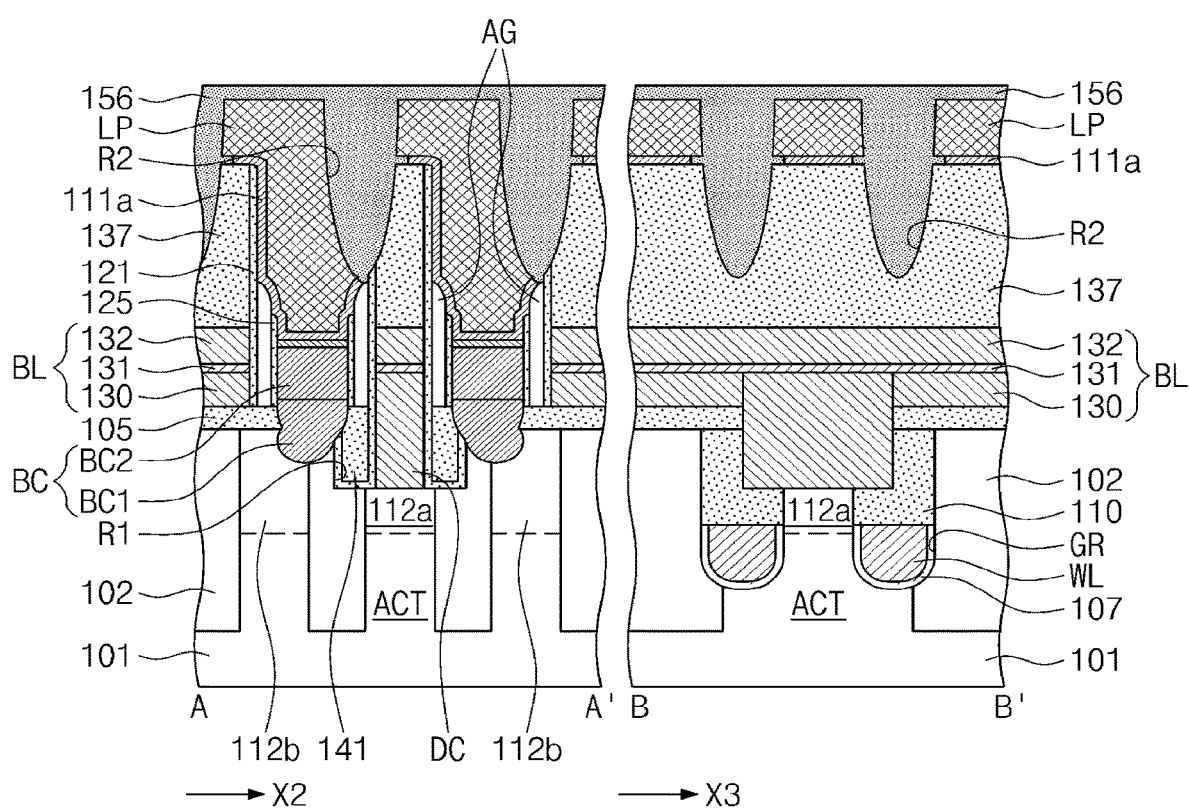

Referring to FIGS. 1 and 20, the pad separation layer 156 may be formed to fill the openings 154 and the second recess regions R2. The pad separation layer 156 may also be formed on the landing pads LP. The pad separation layer 156 may close a top end of the air gap AG.

Figure 21:
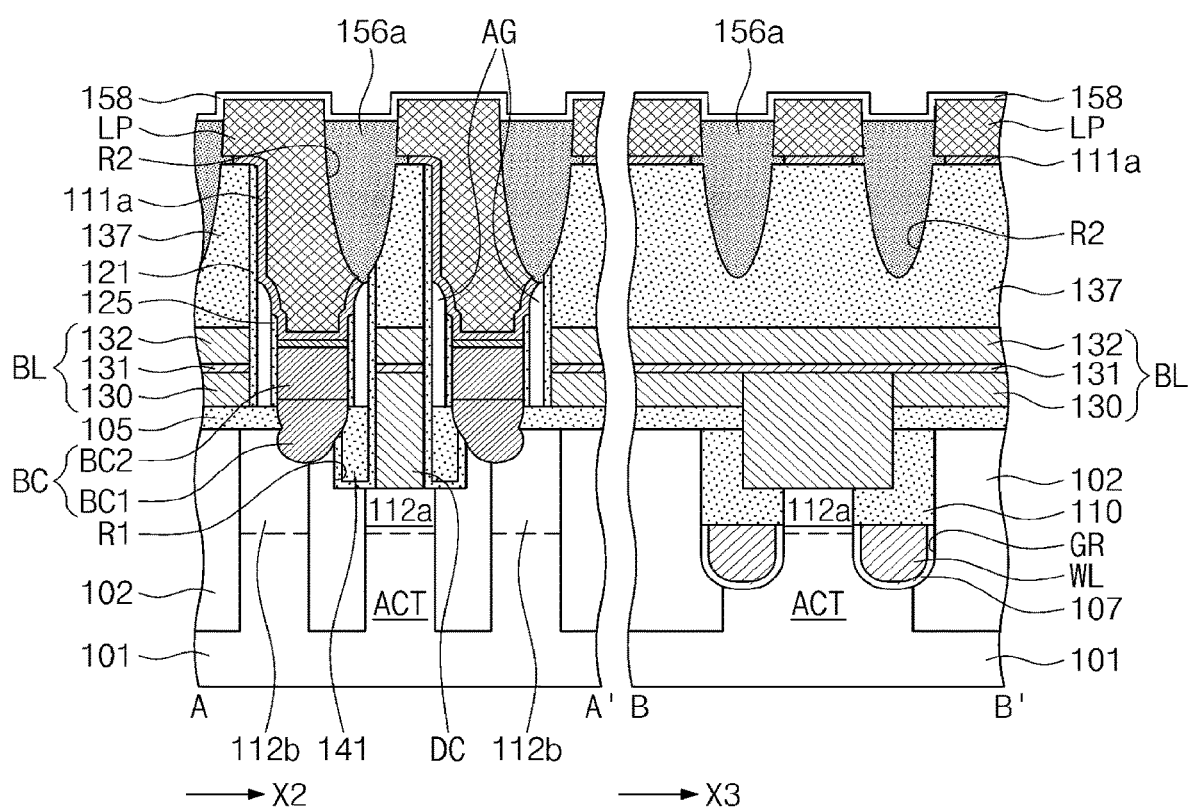

Referring to FIGS. 1 and 21, an upper portion of a pad separation layer 156 may be removed. In an implementation, an anisotropic etching process or an etch-back process may be performed on the pad separation layer 156. By the removal of the upper portion of the pad separation layer 156, top surfaces and upper sidewalls of the landing pads LP may be exposed, and the pad separation pattern 156a may be formed. A first capping layer 158 may be conformally formed on the pad separation pattern 156a and the landing pads LP.

Figure 22:
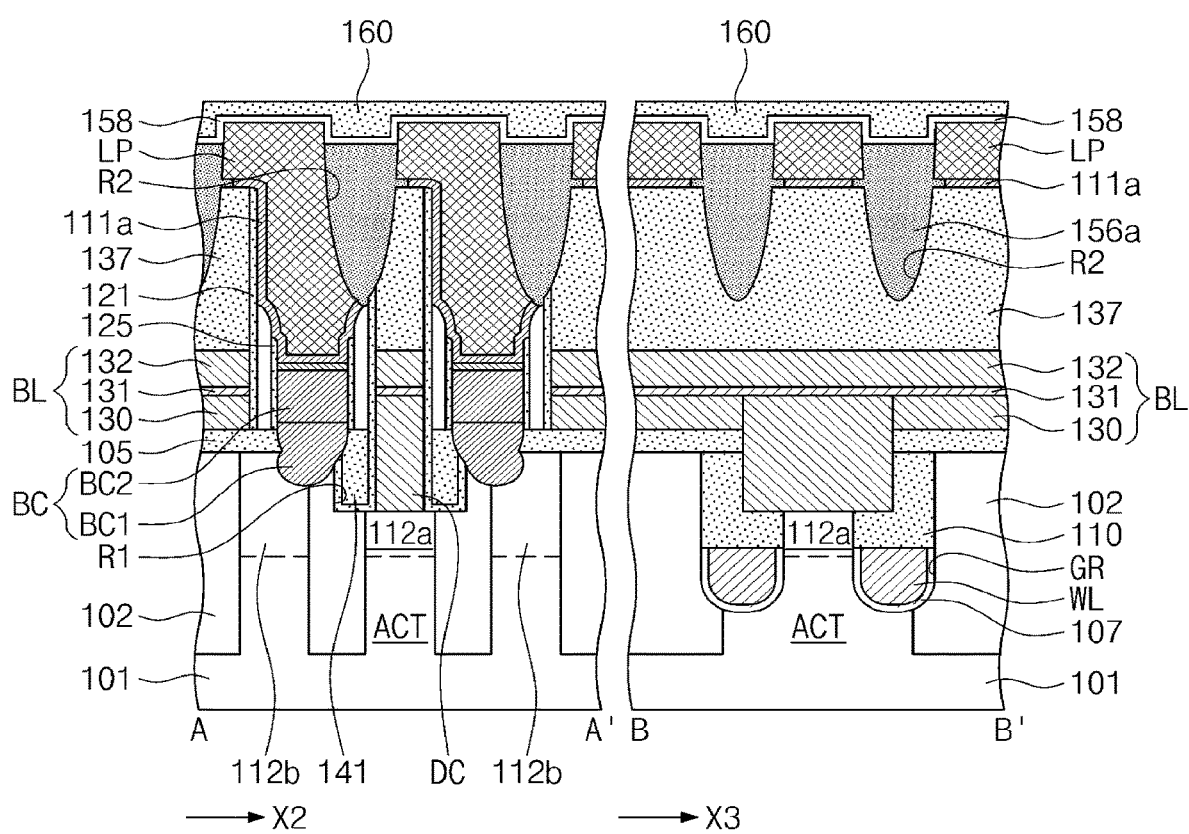

Referring to FIGS. 1 and 22, the second capping layer 160 may be formed on the first capping layer 158. The second capping layer 160 may be formed of, e.g., a silicon nitride layer. The second capping layer 160 may fill a space surrounded by the first capping layer 158 on the pad separation pattern 156a.

Figure 23:
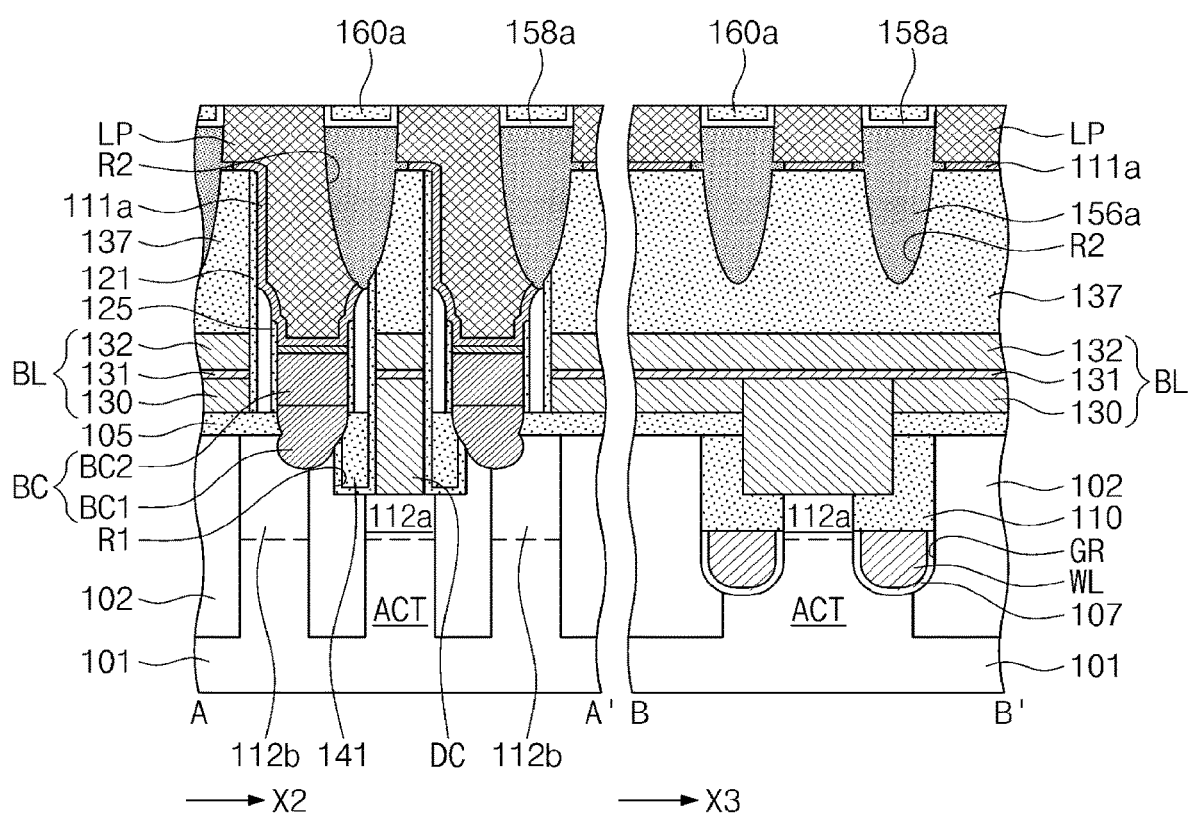

Referring to FIGS. 1 and 23, the first capping layer 158 and the second capping layer 160 may be planarized by performing an etch-back process or a chemical mechanical polishing (CMP) process. A first capping pattern 158a and a second capping pattern 160a which are confined between the landing pads LP may be formed by the planarization process. The first and second capping layers 158 and 160 on the landing pads LP may be removed by the planarization process, and thus the landing pads LP may be exposed.

Referring again to FIGS. 1 and 2, capacitors CAP may be formed on the landing pads LP. In an implementation, an etch stop layer 170 may be formed on the landing pads LP, the first capping pattern 158a, and the second capping pattern 160a.

A first mold layer, a support layer, and a second mold layer may be formed on the etch stop layer 170. Each of the etch stop layer 170 and the support layer may be formed of a silicon nitride layer. The first mold layer and the second mold layer may be formed of a material having an etch selectivity with respect to the support layer. In an implementation, each of the first and second mold layers may be formed of a silicon oxide layer. The second mold layer, the support layer, the first mold layer, and the etch stop layer 170 may be sequentially patterned to form electrode holes exposing the landing pads LP, respectively. A conductive layer may be formed to fill the electrode holes, and the conductive layer on the second mold layer may be removed through an etch-back process or a chemical mechanical polishing (CMP) process to form lower electrodes BE in the electrode holes, respectively.

Thereafter, portions of the second mold layer and the support layer between the lower electrodes BE adjacent to each other may be removed. Thus, a support pattern 174a may be formed, and the first mold layer may be exposed. Subsequently, the first mold layer and the second mold layer may be completely removed by an isotropic etching process to expose surfaces of the lower electrodes BE, the support pattern 174a, and the etch stop layer 170.

An interface layer IFb may be formed on the exposed surfaces of the lower electrodes BE. In this case, the interface layer IFb may also be formed on the exposed surfaces of the support pattern 174a and the etch stop layer 170. A portion of the interface layer IFb may be removed by an etching process. When the interface layer IFb has semiconductor properties, adjacent lower electrodes BE may be electrically connected to each other. Thus, a portion of the interface layer IFb, which is formed on the support pattern 174a and the etch stop layer 170, may be removed.

The dielectric layer DL may be formed on the substrate 101. The dielectric layer DL may cover the interface layer IFb, the support pattern 174a, and the etch stop layer 170. In an implementation, the dielectric layer DL may be formed by depositing, e.g., zirconium oxide (ZrO) or hafnium oxide (HfO).

The upper electrode TE covering the lower electrodes BE may be formed on the dielectric layer DL. The lower electrode BE, the upper electrode TE, the dielectric layer DL between the lower and upper electrodes BE and TE, and the interface layer IFb between the lower electrode BE and the dielectric layer DL may constitute the capacitor CAP.

The semiconductor memory device of FIGS. 1 and 2 may be manufactured as described above.

By way of summation and review, embodiments provide a semiconductor memory device with improved structural stability and a method of manufacturing the same. Embodiments also provide a method of manufacturing a semiconductor memory device, which is capable of reducing or minimizing defects.

That is, in the method of manufacturing the semiconductor memory device according to embodiments, the thermal treatment process may be performed only on an upper portion of the storage node contact (e.g., rather than on the entire storage node contact), and thus the amount of the heat transferred from the storage node contact to the bit line contact may be reduced or minimized (e.g., due to the smaller area that is thermally treated). In addition, a lower portion of the storage node contact may include single-crystal silicon having high thermal conductivity, and thus heat generated from the upper portion of the storage node contact may be released or dissipated through the lower portion of the storage node contact. As a result, the amount of the heat transferred from the storage node contact to the bit line contact may be further reduced. In other words, it is possible to prevent the bit line contact from being damaged in the thermal treatment process of the upper portion of the storage node contact.

A region in which the upper portion of the storage node contact horizontally overlaps with the bit line contact may be small or may not exist, and thus the amount of the heat transferred from the upper portion of the storage node contact to the bit line contact may be small. As a result, the amount of the heat diffusing silicon atoms of the bit line contact may be small. Thus, a seam or void may not occur in the bit line contact.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor memory device, the method comprising:
    preparing a substrate including an active region and a device isolation pattern;
    forming a word line buried in the substrate and crossing the active region of the substrate in a first direction that is parallel to a top surface of the substrate;
    forming a bit line structure on the substrate, the bit line structure including a bit line contact disposed on the active region of the substrate, and a bit line disposed on the bit line contact and crossing the active region of the substrate in a second direction that is parallel to the top surface of the substrate and that is perpendicular to the first direction;
    forming a spacer on a sidewall of the bit line structure;
    exposing a portion of a top surface of the active region of the substrate using the spacer as a mask; and
    forming a storage node contact covering the spacer, wherein forming the storage node contact includes:
        forming a first portion of a single-crystal phase on the portion of the top surface of the active region of the substrate by a selective epitaxial growth process;
        forming a second portion of an amorphous phase on the first portion, the second portion including a void; and
        performing a thermal treatment process on the second portion to remove the void of the second portion, and wherein the amorphous phase of the second portion of the storage node contact is changed into a poly-crystal phase or a single-crystal phase by the thermal treatment process.

2. The method as claimed in claim 1, wherein:
    the first portion of the storage node contact includes single-crystal silicon, and
    after performing the thermal treatment process, the second portion of the storage node contact includes poly-silicon or single-crystal silicon.

3. The method as claimed in claim 1, wherein:
    exposing the portion of the top surface of the active region of the substrate includes removing a part of the active region of the substrate, and
    the first portion of the storage node contact is disposed in a region in which the part of the active region of the substrate is removed.

4. The method as claimed in claim 1, wherein an interface of the first portion and the second portion of the storage node contact is disposed at a higher level than a bottom surface of the bit line contact of the bit line structure, and disposed at a lower level than a top surface of the bit line contact of the bit line structure.

5. The method as claimed in claim 1, wherein an interface of the first portion and the second portion of the storage node contact is disposed at same level with a top surface of the bit line contact of the bit line structure.

6. The method as claimed in claim 1, further comprising forming an interlayer insulating pattern on the substrate,
    wherein a part of the interlayer insulating pattern is removed during exposing of the portion of the top surface of the active region of the substrate, and
    wherein a lower part of the first portion of the storage node contact is disposed under the interlayer insulating pattern.

7. The method as claimed in claim 1, further comprising forming an interlayer insulating pattern on the substrate,
    wherein the bit line contact of the bit line structure penetrates the interlayer insulating pattern and contacts the active region of the substrate, and
    wherein the storage node contact penetrates the interlayer insulating pattern and contacts the active region of the substrate.

8. The method as claimed in claim 7, wherein:
    the first portion of the storage node contact includes a first side surface that faces the bit line contact of the bit line structure,
    the second portion of the storage node contact includes a second side surface that faces the bit line contact of the bit line structure, and
    a distance between the first side surface of the first portion of the storage node contact and the bit line contact of the bit line structure in the first direction is greater than a distance between the second side surface of the second portion of the storage node contact and the bit line contact of the bit line structure in the first direction.

9. The method as claimed in claim 7, wherein:
    a lower part of the first portion of the storage node contact includes a first side surface that faces the bit line contact of the bit line structure,
    an upper part of first portion of the storage node contact includes a second side surface that faces the bit line contact of the bit line structure, and
    a distance between the first side surface of the lower part of the first portion of the storage node contact and the bit line contact of the bit line structure in the first direction is greater than a distance between the second side surface of the upper part of the first portion of the storage node contact and the bit line contact of the bit line structure in the first direction.

10. The method as claimed in claim 9, wherein:
the lower part of the first portion of the storage node contact is in contact with the active region and the device isolation pattern of the substrate, and
the upper part of the first portion of the storage node contact is in contact with the interlayer insulating pattern and the spacer.

11. A method of manufacturing a semiconductor memory device, the method comprising:
preparing a substrate including an active region and a device isolation pattern;
forming a word line buried in the substrate and crossing the active region of the substrate in a first direction that is parallel to a top surface of the substrate;
forming a bit line structure on the substrate, the bit line structure including a bit line contact disposed on the active region of the substrate, and a bit line disposed on the bit line contact and crossing the active region of the substrate in a second direction that is parallel to the top surface of the substrate and that is perpendicular to the first direction;
forming a spacer on a sidewall of the bit line structure;
exposing a portion of a top surface of the active region of the substrate using the spacer as a mask; and
forming a storage node contact covering the spacer, wherein forming the storage node contact includes:
forming a first portion on the portion of the top surface of the active region of the substrate by a selective epitaxial growth process;
forming a second portion on the first portion, the second portion including a void; and
performing a thermal treatment process on the second portion to remove the void of the second portion,
wherein a crystallinity of the first portion of the storage node contact is different from a crystallinity of the second portion of the storage node contact, and
wherein an interface of the first portion and the second portion of the storage node contact is at a level between a bottom surface and a top surface of the bit line contact.

12. The method as claimed in claim 11, wherein the crystallinity of the first portion of the storage node contact is higher than the crystallinity of the second portion of the storage node contact.

13. The method as claimed in claim 11, wherein, before performing the thermal treatment process:
the first portion of the storage node contact includes a single-crystal phase, and
the second portion of the storage node contact includes an amorphous phase.

14. The method as claimed in claim 11, wherein:
the first portion of the storage node contact includes single-crystal silicon, and
after performing the thermal treatment process, the second portion of the storage node contact includes poly-silicon or single-crystal silicon.

15. The method as claimed in claim 11, wherein, after performing the thermal treatment process, the amorphous phase of the second portion of the storage node contact is changed into a poly-crystal phase or a single-crystal phase by the thermal treatment process.

16. The method as claimed in claim 11, wherein:
exposing the portion of the top surface of the active region of the substrate includes removing a part of the active region, and
the first portion of the storage node contact is disposed in a region in which the part of the active region of the substrate is removed.

17. The method as claimed in claim 11, further comprising forming an interlayer insulating pattern on the substrate, wherein:
a part of the interlayer insulating pattern is removed during exposing of the portion of the top surface of the active region of the substrate,
the first portion of the storage node contact includes a lower part and an upper part that is disposed on the lower part,
the lower part of the first portion of the storage node contact penetrates the interlayer insulating pattern and is in contact with the active region and the device isolation pattern of the substrate, and
the upper part of the first portion of the storage node contact is in contact with the interlayer insulating pattern and the spacer.

18. The method as claimed in claim 11, further comprising forming an interlayer insulating pattern on the substrate, wherein:
the first portion of the storage node contact includes a lower part and an upper part that is disposed on the lower part,
the lower part of the first portion of the storage node contact includes a first side surface that faces the bit line contact of the bit line structure,
the upper part of the first portion of the storage node contact includes a second side surface that faces the bit line contact of the bit line structure, and
a distance between the first side surface of the lower part of the first portion of the storage node contact and the bit line contact of the bit line structure in the first direction is greater than a distance between the second side surface of the upper part of the first portion of the storage node contact and the bit line contact of the bit line structure in the first direction.

19. The method as claimed in claim 11, wherein:
the first portion of the storage node contact includes a first side surface that faces the bit line contact of the bit line structure,
the second portion of the storage node contact includes a second side surface that faces the bit line contact of the bit line structure, and
a distance between the first side surface of the first portion of the storage node contact and the bit line contact of the bit line structure in the first direction is greater than a distance between the second side surface of the second portion of the storage node contact and the bit line contact of the bit line structure in the first direction.

20. A method of manufacturing a semiconductor memory device, the method comprising:
preparing a substrate including an active region and a device isolation pattern;
forming a word line buried in the substrate and crossing the active region of the substrate in a first direction that is parallel to a top surface of the substrate;
forming an interlayer insulating pattern on the substrate;
forming a bit line structure on the substrate, the bit line structure including a bit line contact disposed on the active region of the substrate, and a bit line disposed on the bit line contact and crossing the active region of the substrate in a second direction that is parallel to the top surface of the substrate and that is perpendicular to the first direction;

forming a spacer on a sidewall of the bit line structure;

exposing a portion of a top surface of the active region of the substrate by removing a part of the interlayer insulating pattern;

forming a first portion of a storage node contact on the portion of the top surface of the active region of the substrate by a selective epitaxial growth process;

forming a second portion of the storage node contact on the first portion of the storage node contact; and performing a thermal treatment process on the second portion of the storage node contact, wherein:

the first portion of the storage node contact includes single-crystal silicon, the second portion of the storage node contact includes poly-silicon or single-crystal silicon, the first portion of the storage node contact includes a lower part and an upper part that is disposed on the lower part, the lower part of the first portion of the storage node contact is in contact with the active region and the device isolation pattern of the substrate, the upper part of the first portion of the storage node contact is in contact with the interlayer insulating pattern and the spacer, the lower part of the first portion of the storage node contact includes a first side surface that faces the bit line contact of the bit line structure, the upper part of the first portion of the storage node contact includes a second side surface that faces the bit line contact of the bit line structure, the second portion of the storage node contact includes a third side surface that faces the bit line contact of the bit line structure, a distance between the first side surface of the lower part of the first portion of the storage node contact and the bit line contact of the bit line structure in the first direction is greater than a distance between the second side surface of the upper part of the first portion of the storage node contact and the bit line contact of the bit line structure in the first direction, and the distance between the second side surface of the upper part of the first portion of the storage node contact and the bit line contact of the bit line structure in the first direction is greater than a distance between the third side surface of the second portion of the storage node contact and the bit line contact of the bit line structure.

* * * * *